US012431434B2

(12) United States Patent
Kasuga et al.

(10) Patent No.: US 12,431,434 B2
(45) Date of Patent: Sep. 30, 2025

(54) BUILT-IN COMPONENT BOARD, METHOD OF MANUFACTURING THE BUILT-IN COMPONENT BOARD

(71) Applicant: SHINKO ELECTRIC INDUSTRIES CO., LTD., Nagano (JP)

(72) Inventors: Takashi Kasuga, Nagano (JP); Takashi Sato, Nagano (JP); Yasuyuki Yamaguchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 590 days.

(21) Appl. No.: 17/674,231

(22) Filed: Feb. 17, 2022

(65) Prior Publication Data

US 2022/0278045 A1 Sep. 1, 2022

(30) Foreign Application Priority Data

Mar. 1, 2021 (JP) ................. 2021-032142

(51) Int. Cl.
*H01L 23/538* (2006.01)
*H01L 21/48* (2006.01)
(Continued)

(52) U.S. Cl.
CPC ........ *H01L 23/5384* (2013.01); *H01L 21/486* (2013.01); *H01L 21/76802* (2013.01);
(Continued)

(58) Field of Classification Search
CPC ........... H01L 23/5384; H01L 23/53204; H01L 23/5385; H01L 23/5386; H01L 21/486; H01L 21/76802; H01L 21/76877
See application file for complete search history.

(56) References Cited

U.S. PATENT DOCUMENTS

| 9,972,558 B1* | 5/2018 | Talledo | H01L 24/11 |
| 2009/0236321 A1* | 9/2009 | Hayashi | H01R 4/029 |
| | | | 219/121.64 |

(Continued)

FOREIGN PATENT DOCUMENTS

| JP | S63-44745 A | 2/1988 |
| JP | 2016-66799 A | 4/2016 |

(Continued)

OTHER PUBLICATIONS

Japanese Decision to Grant a Patent dated Jul. 16, 2024 issued in corresponding Japanese application No. 2021-032142; English translation included (3 pages).

*Primary Examiner* — Christine A Enad
(74) *Attorney, Agent, or Firm* — Rankin, Hill & Clark LLP

(57) ABSTRACT

A built-in component board includes a first insulating layer; wiring layer and a metal pad layer that are formed on the first insulating layer; a second insulating layer that is formed on the wiring layer and the metal pad layer; and a cavity that is formed on the second insulating layer and that exposes the metal pad layer. Furthermore, the built-in component board includes an electronic component that is mounted on the metal pad layer; and a filling layer that is filled in the cavity and that buries the electronic component. Furthermore, a metal used for the metal pad layer includes a metal having thermal conductivity that is lower than that of a metal used for the wiring layer.

11 Claims, 28 Drawing Sheets

(51) Int. Cl.
    *H01L 21/768*    (2006.01)
    *H01L 23/532*    (2006.01)
(52) U.S. Cl.
    CPC .. *H01L 21/76877* (2013.01); *H01L 23/53204* (2013.01); *H01L 23/5385* (2013.01); *H01L 23/5386* (2013.01)

(56) References Cited

U.S. PATENT DOCUMENTS

| | | | |
|---|---|---|---|
| 2017/0034908 A1* | 2/2017 | Hsu | H01L 23/49822 |
| 2021/0175159 A1* | 6/2021 | Park | H01L 21/4857 |
| 2021/0185819 A1* | 6/2021 | Hwang | H05K 1/182 |
| 2021/0193563 A1* | 6/2021 | Byun | H01L 21/4857 |
| 2022/0068760 A1* | 3/2022 | Chen | H01L 24/19 |

FOREIGN PATENT DOCUMENTS

| | | |
|---|---|---|
| JP | 2016-096170 | 5/2016 |
| JP | 2016-149411 | 8/2016 |
| JP | 2019-121626 A | 7/2019 |
| JP | 2020-181934 | 11/2020 |
| WO | 2007/043714 A1 | 4/2007 |

\* cited by examiner

FIG.11

BUILT-IN COMPONENT BOARD, METHOD OF MANUFACTURING THE BUILT-IN COMPONENT BOARD

CROSS-REFERENCE TO RELATED APPLICATION

This application is based upon and claims the benefit of priority of the prior Japanese Patent Application No. 2021-032142, filed on Mar. 1, 2021, the entire contents of which are incorporated herein by reference.

FIELD

The embodiments discussed herein are related to a built-in component board and a method of manufacturing the built-in component board.

BACKGROUND

In recent years, in order to implement a high-density component mounting technique, for example, a built-in component board having electronic components of, for example, a capacitor and the like, built into the board has been drawing attention. The built-in component board is manufactured by providing a cavity on a board that is formed by laminating layers constituted by, for example, insulating resin layers and conductor layers, and filling a filling resin in the cavity in which the electronic component is arranged.

The electronic component is adhered to the conductor layer located in the inner part of the board by using, for example, an adhesive material or the like. Specifically, the electronic component is temporarily adhered to a copper pad layer that is included in the conductor layer and that is exposed from the bottom surface of the cavity by using the adhesive material that is in a semi cured state, and then, a filling resin is filled into the cavity while maintaining the adhesive material being in the semi cured state. Then, the adhesive material that is in the semi cured state is subjected to thermal curing at the same time at which the filling resin is subjected to thermal curing, so that the electronic components that are built into the board are adhered to the copper pad layer. Then, a via is formed in the filling resin that is located on the upper side of the electronic component, and an electrode of the electronic component is connected to the wiring layer located on the top surface of the board by using the via, whereby the built-in component board is manufactured.

Patent Document 1: Japanese Laid-open Patent Publication No. 2016-096170
Patent Document 2: Japanese Laid-open Patent Publication No. 2020-181934
Patent Document 3: Japanese Laid-open Patent Publication No. 2016-149411

However, in a step of forming a cavity in a part of the insulating resin layer by using a process of laser beam machining, the temperature of the copper pad layer that is located on the bottom surface of the cavity is increased caused by processing heat generated at the time of the process of laser beam machining, and the temperature of the interfacial surface of the insulating resin layer that is located on the lower surface of the copper pad layer is also increased. As a result, the quality of the interfacial surface of the insulating resin layer that is located on the lower surface of the copper pad layer on the bottom surface of the cavity is changed due to an increase in temperature caused by the processing heat, so that a sticking force between a metal pad layer that is the copper pad layer and the insulating resin layer is decreased.

SUMMARY

According to an aspect of an embodiment, a built-in component board includes a first insulating layer, a wiring layer and a metal pad layer, a second insulating layer, a cavity, an electronic component and a filling layer. The wiring layer and the metal pad layer are formed on the first insulating layer. The second insulating layer is formed on the wiring layer and the metal pad layer. The cavity is formed in the second insulating layer that exposes the metal pad layer. The electronic component is mounted on the metal pad layer. The filling layer is filled in the cavity and buries the electronic component. A metal used for the metal pad layer includes a metal having thermal conductivity that is lower than that of a metal used for the wiring layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a diagram illustrating an example of a second electrolytic plating layer forming step of the built-in component board.

DESCRIPTION OF EMBODIMENTS

Preferred embodiments of a built-in component board and a method of manufacturing the built-in component board disclosed in the present invention will be explained in detail below with reference to the accompanying drawings. Furthermore, the present invention is not limited to the embodiments.

First Embodiment

Figure 1:
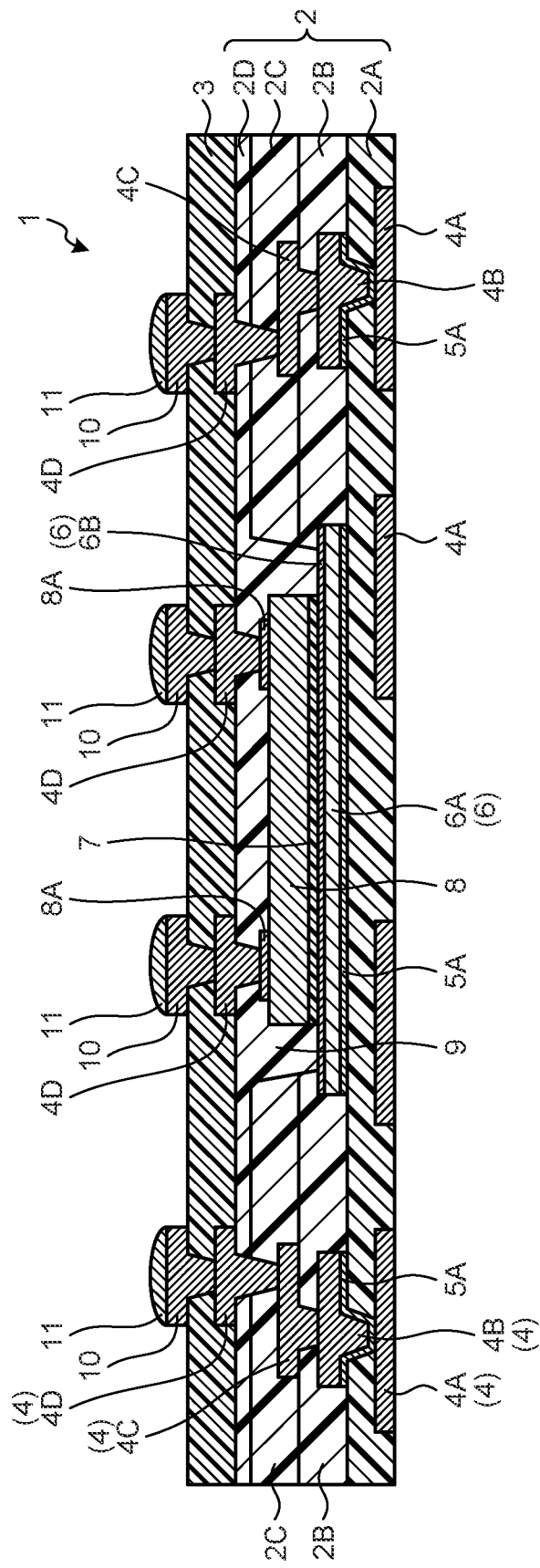
FIG. 1 is a diagram illustrating an example of a built-in component board (coreless build-up wiring board) according to a first embodiment.

FIG. 1 is a diagram illustrating an example of a built-in component board (coreless build-up wiring board) 1 according to a first embodiment. FIG. 1 schematically illustrates a schematic cross-sectional view of the built-in component board 1. The built-in component board 1 illustrated in FIG. 1 has a laminated structure and is a coreless build-up wiring board that includes a build-up layer 2 and a solder resist layer 3 as main layers. Furthermore, an electronic component 8, including a capacitor, a semiconductor chip, and the like, is buried in the build-up layer 2. The build-up layer 2 is further divided into a first layer 2A, a second layer 2B, a third layer 2C, and a filling layer 2D. A conductor layer 4 (4A, 4B, 4C, and 4D) formed such that adjacent layers are connected by a via is included in the first layer 2A, the second layer 2B, and the third layer 2C. In the following, as illustrated in FIG. 1, a description will be made on the assumption that the first layer 2A is the lowermost layer and the solder resist layer 3 is the uppermost layer; however, the built-in component board 1 may be used by, for example, vertically inverting the surfaces, or may be used in an arbitrary orientation.

The first layer 2A is, for example, a first insulating layer that is formed of an insulating resin layer and the wiring layer 4A. The insulating resin layer that forms the first layer 2A is cured by performing a thermal curing process and holds the wiring layer 4A that is located in the inner part of the first layer 2A at a predetermined position.

The second layer 2B is, for example, a second insulating layer that is laminated on the upper side of the first layer 2A in a manner adjacent to the first layer 2A, and is formed of an insulating resin layer and the wiring layer 4B. The insulating resin layer that forms the second layer 2B is cured by performing a thermal curing process and holds the wiring layer 4B that is located in the inner part of the second layer 2B at a predetermined position. The wiring layer 4B that is located in the inner part of the second layer 2B is connected to the wiring layer 4A hat is located in the inner part of the first layer 2A by a via.

The third layer 2C is laminated on the upper side of the second layer 2B in a manner adjacent to the second layer 2B, and is formed of an insulating resin layer and the wiring layer 4C. The insulating resin layer that forms the third layer 2C is cured by performing a thermal curing process and holds the wiring layer 4C that is located in the inner part of the third layer 2C at a predetermined position. The wiring layer 4C that is located in the inner part of the third layer 2C is connected to the wiring layer 4B that is located in the inner part of the second layer 2B by a via. The electronic component 8 is buried in the second layer 2B and the third layer 2C. Furthermore, a cavity 9 that exposes a surface of a predetermined portion of the first layer 2A and that is used to accommodate the electronic component 8 is formed in the second layer 2B and the third layer 2C.

The filling layer 2D is a layer that is formed of a filling resin that is filled into the cavity 9 at a filling step that will be described later. The wiring layers 4D are formed on the top surface of the filling layer 2D and are covered by the solder resist layer 3. In the filling layer 2D, a via is formed after having performed the filling step, the wiring layer 4C or an electrode 8A of the electronic component 8 that is located in the inner part of the third layer 2C is connected to the wiring layer 4D that is formed on the top surface of the surface of the filling layer 2D. The filling resin that forms the filling layer 2D may be the same resin as the insulating resin layer that forms the first layer 2A to the third layer 2C. Furthermore, the filling layer 2D is a type of an insulating layer.

The conductor layer 4 is formed of, for example, a metal, such as copper, and is held at a predetermined position by the insulating resin layer formed in each of the layers. The conductor layers 4 that are formed in the adjacent layers are connected through a via that is formed in each of the layers and are capable of being energized. Furthermore, the conductor layer 4 that is located in the inner part of the second layer 2B includes, in addition to the wiring layer 4B, a metal pad layer 6 that is formed in the cavity 9. In the metal pad layer 6 formed in the cavity 9, the electronic component 8 is adhered by an adhesive material 7. Furthermore, the adhesive material 7 is an adhesive material, such as a die attachment film (DAF).

The metal pad layer 6 includes a first metal layer 6A that is formed at a predetermined portion on the surface of the first layer 2A that is exposed to the cavity 9, and a second metal layer 6B that is formed on the first metal layer 6A that is formed in the cavity 9. Furthermore, on the second metal layer 6B formed in the cavity 9, the electronic component 8 is connected via the adhesive material 7. The first metal layer 6A includes a metal having thermal conductivity that is lower than thermal conductivity of the metal that is used for the conductor layer 4, such as the wiring layer. The metal used for the first metal layer 6A is nickel that is used for, for example, an electrolytic nickel plating layer, having thermal conductivity that is lower than thermal conductivity of copper that is the main material of the wiring layer of, for example, an electrolytic copper plating layer, and exhibiting a high elastic modulus as the quality of the material. Furthermore, in addition to nickel, another example of metal used for the first metal layer 6A includes a metal, such as iron. Furthermore, the second metal layer 6B is, for example, a metal layer made of copper having high reflectivity in laser beam machining.

The metal pad layer 6 is formed on a seed layer 5A that has been subjected to electroless copper plating and that is located on the surface of the first layer 2A that exposes to the cavity 9 that is formed in the second layer 2B and the third layer 2C. The first metal layer 6A included in the metal pad layer 6 is formed on the seed layer 5A on the first layer 2A that exposes to the cavity 9. Furthermore, the thickness of each of the first metal layer 6A and the second metal layer 6B may be arbitrarily set regardless of the thickness of the wiring layer 4B that forms the second layer 2B or the wiring layer 4C that forms the third layer 2C.

The solder resist layer 3 is a layer that covers the wiring layer 4D that is arranged on the top surface of the filling layer 2D that constitutes the build-up layer 2 and that protects the wiring layer 4D. Furthermore, the solder resist layer 3 is a type of the insulating layer. For example, at a portion on which an external component, such as a semiconductor chip 50, is mounted, an opening portion is provided in the solder resist layer 3, and a bump 11 that is connected to the wiring layer 4D located on the top surface of the build-up layer 2 is formed.

The electronic component 8 is an electronic component including, for example, a capacitor and a semiconductor chip, and is buried in the cavity 9 formed in the second layer 2B and the third layer 2C. In other words, by filling a filling resin around the electronic component 8, the electronic component 8 is embedded in the filling layer 2D that constitutes the build-up layer 2. The lower surface of the electronic component 8 is an adhesive surface that is adhered to the second metal layer 6B included in the metal pad layer 6 by the adhesive material 7.

Figure 2:
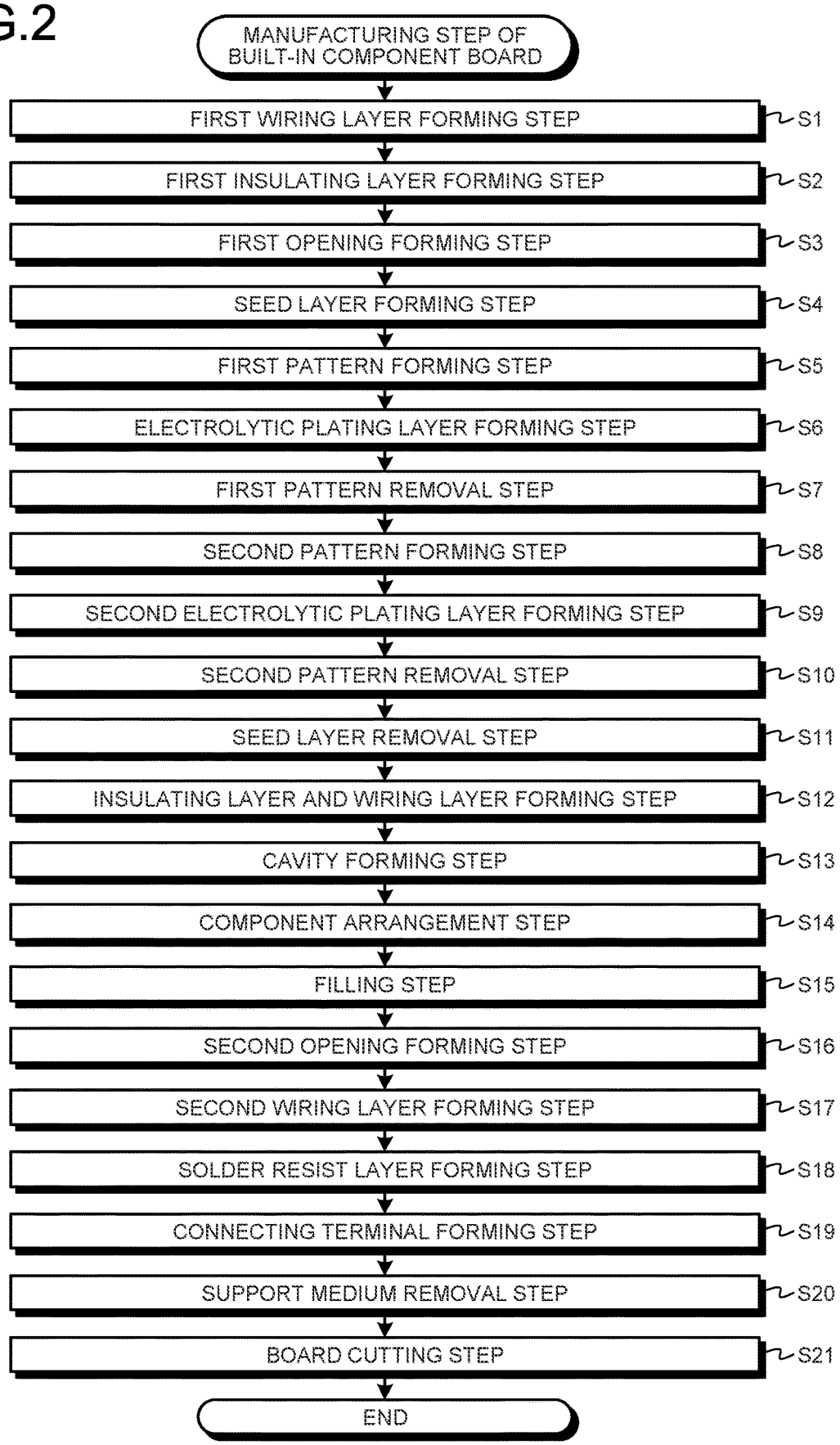
FIG. 2 is a flowchart illustrating an example of the flow of a manufacturing step of the built-in component board.

In the following, a manufacturing step of the built-in component board 1 will be described. FIG. 2 is a flowchart illustrating an example of the flow of the manufacturing step of the built-in component board 1. In FIG. 2, as the manufacturing step of the built-in component board 1, the first wiring layer forming step of forming the wiring layer 4A included in the first layer 2A on a support medium 12 is performed (Step S1). Furthermore, on the support medium 12, a plurality of built-in component board forming areas 12A are formed in a grid-shaped manner. The built-in component board 1 is formed on each of the built-in component board forming areas 12A. That is, the plurality of built-in component boards 1 are formed on a single piece of the support medium 12. As the manufacturing step, after having performed the first wiring layer forming step, a first insulating layer forming step of forming the first layer 2A on the support medium 12 is performed (Step S2).

Furthermore, as the manufacturing step, after having performed the first insulating layer forming step, a first opening forming step of forming an opening on the first layer 2A is performed (Step S3). As the manufacturing step, after having performed the first opening forming step, a seed layer forming step of forming the seed layer 5A on the first layer 2A is performed (Step S4).

Furthermore, as the manufacturing step, after having performed the seed layer forming step, a first pattern forming step of forming a plating resist pattern for forming, on the seed layer 5A, the wiring layer 4B included in the second layer 2B is performed (Step S5). As the manufacturing step, after having performed the first pattern forming step, a first electrolytic plating layer forming step of forming an electrolytic plating layer constituting the wiring layer 4B included in the second layer 2B is performed (Step S6). As the manufacturing step, after having performed the first electrolytic plating layer forming step, a first pattern removal step of removing the plating resist pattern formed on the seed layer 5A is performed (Step S7).

Furthermore, as the manufacturing step, after having performed the first pattern removal step, a second pattern forming step of forming a plating resist pattern for forming the metal pad layer 6 on a predetermined portion on the seed layer 5A is performed (Step S8). As the manufacturing step, after having performed the second pattern forming step, a second electrolytic plating layer forming step of forming the first metal layer 6A on the seed layer 5A and forming the second metal layer 6B on the first metal layer 6A is performed (Step S9). Furthermore, at the second electrolytic plating layer forming step, the metal pad layer 6 is to be formed on the seed layer 5A.

Furthermore, as the manufacturing step, after having performed the second electrolytic plating layer forming step, a second pattern removal step of removing the plating resist pattern formed at the second pattern forming step is performed (Step S10). Furthermore, as the manufacturing step, after having performed the second pattern removal step, a seed layer removal step of removing a portion associated with the unneeded portion of the seed layer 5A on the first layer 2A (Step S11). As the manufacturing step, after having performed the seed layer removal step, an insulating layer and wiring layer forming step of forming the second layer 2B, the wiring layer 4B included in the second layer 2B, the third layer 2C, and the wiring layer 4C included in the third layer 2C is performed (Step S12).

Furthermore, as the manufacturing step, after having performed the insulating layer and wiring layer forming step, a cavity forming step of forming the cavity 9 in the second layer 2B and the third layer 2C is performed such that the surface of the second metal layer 6B included in the metal pad layer 6 included in the second layer 2B is exposed (Step S13). As the manufacturing step, after having performed the cavity forming step, a component arrangement step of arranging, through the adhesive material 7, electronic component 8 on the metal pad layer 6 in the cavity 9 formed in the second layer 2B and the third layer 2C (Step S14).

Furthermore, as the manufacturing step, after having performed the component arrangement step, a filling step of burying the electronic component 8 in the cavity 9 in the filling layer 2D is performed by filling a filling resin in the cavity 9 (Step S15). As the manufacturing step, after having performed the filling step, a second opening forming step of forming an opening in the filling layer 2D (Step S16). The opening is, for example, is an opening for forming a via that is used to connect the electrode 8A of the electronic component 8 or the wiring layer 4C that forms the third layer 2C in the cavity 9.

Furthermore, as the manufacturing step, after having performed the second opening forming step, a second wiring layer forming step for forming the wiring layer 4D on the filling layer 2D is performed (Step S17). As the manufacturing step, after having performed the second wiring layer forming step, a solder resist layer forming step of forming the solder resist layer 3 on the filling layer 2D is performed (Step S18).

As the manufacturing step, after having performed the solder resist layer forming step, a connecting terminal forming step of forming a connecting terminal 10 on the solder resist layer 3 is performed (Step S19). Furthermore, as the manufacturing step, after having performed the connecting terminal forming step, a support medium removal step of removing the support medium 12 that is located under the first layer 2A in the built-in component board 1 on which the connecting terminal 10 is formed is performed (Step S20). Furthermore, as the manufacturing step, after having performed the support medium removal step, a board cutting step of cutting the built-in component board 1 from which the support medium 12 has been removed is performed (Step S21), and the built-in component board 1 is to be completed. Furthermore, in the board cutting process, after having removed the support medium 12, the plurality of built-in component boards 1 are obtained by cutting the build-up layer 2 and the solder resist layer 3 located between the built-in component board forming areas 12A along a cutting line of an inner side of each of the built-in component board forming areas 12A.

Figure 3:
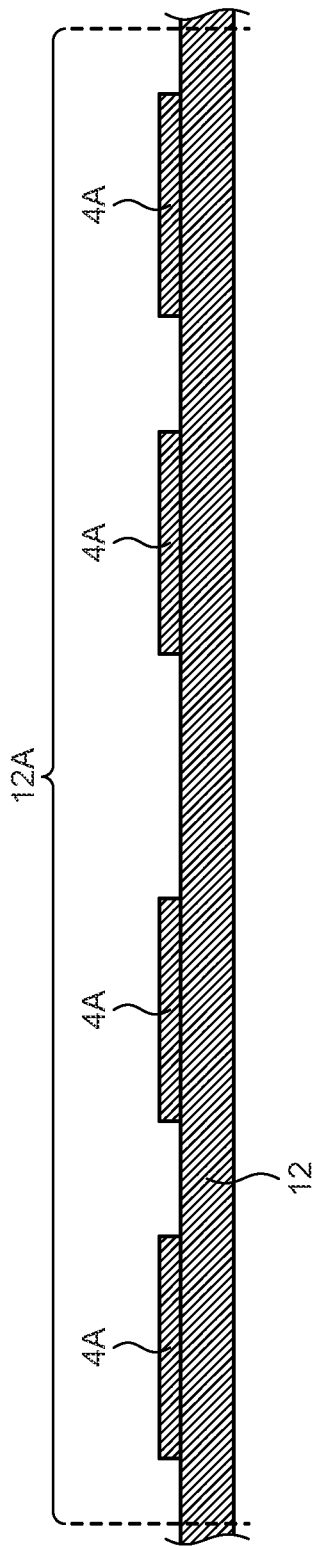
FIG. 3 is a diagram illustrating an example of a first wiring layer forming step of the built-in component board.

FIG. 3 is a diagram illustrating an example of the first wiring layer forming step of the built-in component board 1. Furthermore, in the example illustrated in FIG. 3, for convenience of description, a description will be made by illustrating a single piece of the built-in component board forming area 12A. In the first wiring layer forming step performed at Step S1, as illustrated in FIG. 3, for example, the wiring layers 4A are formed on the support medium 12 that is formed of a metal plate, a metal foil, or the like. Specifically, a photosensitive resin layer is formed on the support medium 12, and exposure and image development are performed. As a result, a plating resist pattern having an opening portion that is used to expose a part of the support medium 12 is formed on the support medium 12. Furthermore, by performing an electrolytic copper plating process on the support medium 12 on which the plating resist pattern has been formed, a copper plating layer is formed on the support medium 12 that is exposed from the plating resist pattern. Then, by removing the plating resist pattern from the support medium 12, the wiring layer 4A serving as, for example, an external connecting terminal is thus formed on the support medium 12.

Figure 4:
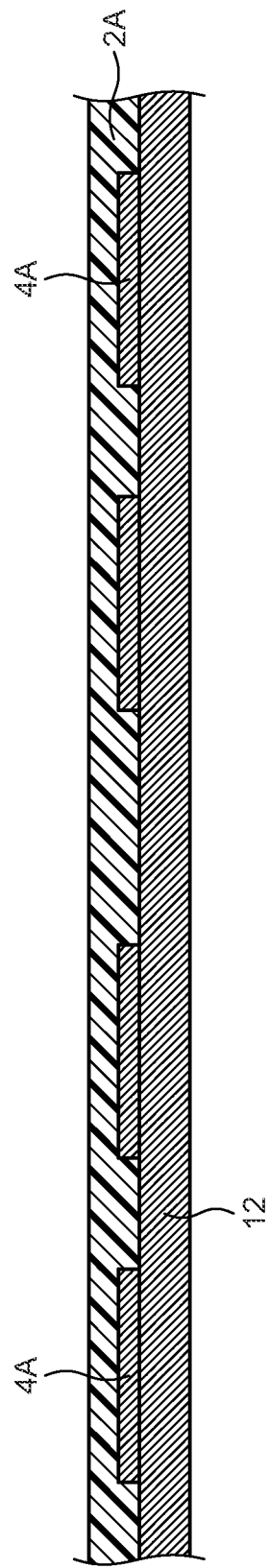
FIG. 4 is a diagram illustrating an example of a first insulating layer forming step of the built-in component board.

FIG. 4 is a diagram illustrating an example of the first insulating layer forming step of the built-in component board 1. At the first insulating layer forming step performed at Step S2, as illustrated in FIG. 4, the first layer 2A is formed on the support medium 12 on which the wiring layers 4A are formed. Specifically, for example, by laminating a resin film formed of an epoxy resin, a polyimide resin, or the like on the support medium 12, the first layer 2A corresponding to the insulating resin layer is formed on the support medium 12.

Figure 5:
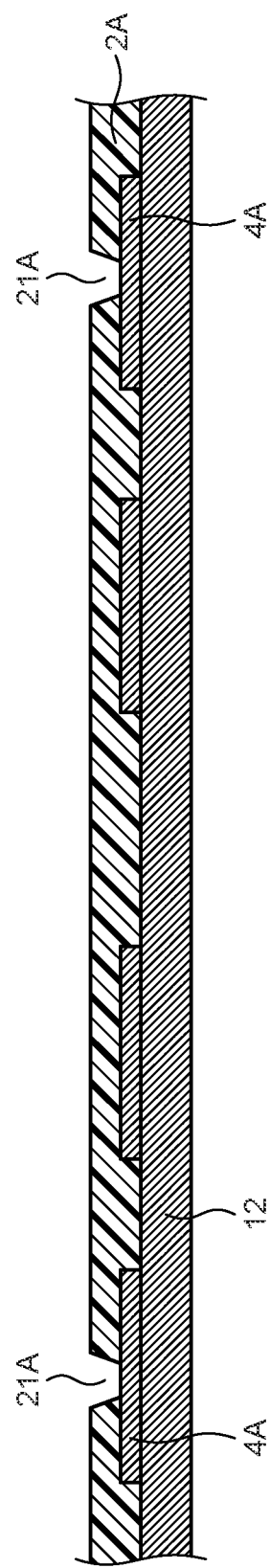
FIG. 5 is a diagram illustrating an example of a first opening forming step of the built-in component board.

FIG. 5 is a diagram illustrating an example of the first opening forming step of the built-in component board 1. At the first opening forming step performed at Step S3, as illustrated in FIG. 5, openings 21A are formed on the first layer 2A. Specifically, the openings 21A are to be formed at predetermined positions on the first layer 2A by performing a process of laser beam machining. As a result, each of the openings 21A formed on the first layer 2A exposes a part of the wiring layer 4A corresponding to a lower layer. Furthermore, each of the openings 21A is formed in an inverted truncated cone shape having a larger diameter on the top surface side of the first layer 2A than the diameter on the surface side from which the wiring layer 4A is exposed.

Figure 6:
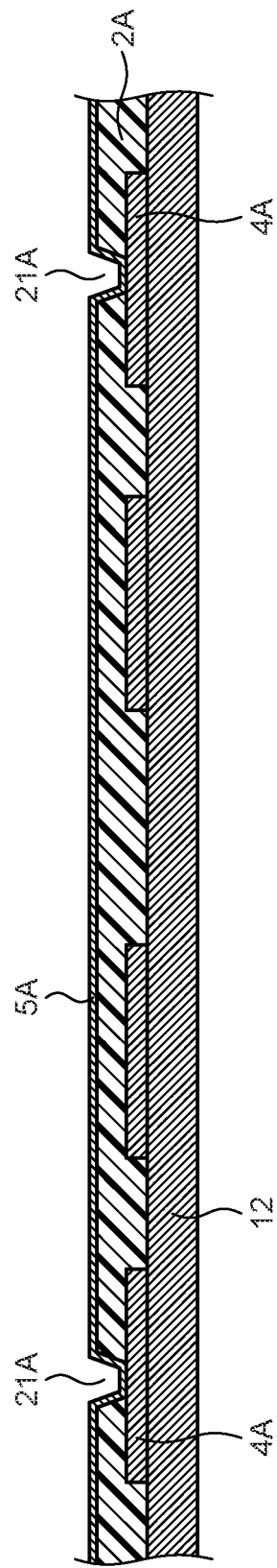
FIG. 6 is a diagram illustrating an example of a seed layer forming step of the built-in component board.

FIG. 6 is a diagram illustrating an example of the seed layer forming step of the built-in component board 1. At the seed layer forming step performed at Step S4, as illustrated in FIG. 6, the seed layer 5A is formed on the first layer 2A in which the first opening forming step has been performed. Specifically, by performing, for example, an electroless copper plating process, the seed layer 5A subjected to electroless copper plating is thus formed on the first layer 2A. Furthermore, the seed layer 5A that has been subjected to electroless copper plating is also thus formed on the inner wall of the opening 21A and the surface of the wiring layer 4A that is exposed to the opening 21A.

Figure 7:
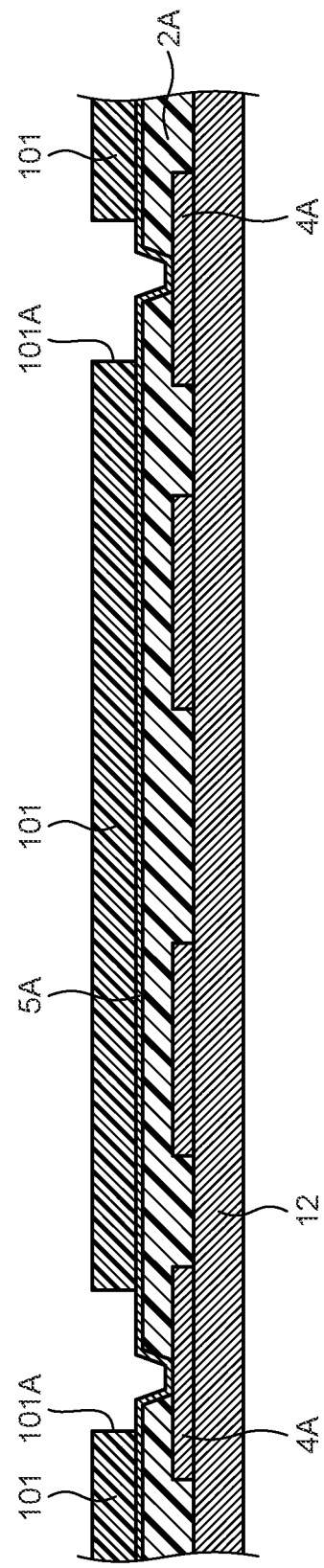
FIG. 7 is a diagram illustrating an example of a first pattern forming step of the built-in component board.

FIG. 7 is a diagram illustrating an example of the first pattern forming step of the built-in component board 1. At the first pattern forming step performed at Step S5, as illustrated in FIG. 7, a plating resist pattern 101 for forming the wiring layer 4B on the seed layer 5A is formed. Specifically, for example, a photosensitive resin layer is formed on the seed layer 5A, and exposure and image development are performed, so that the plating resist pattern 101 is formed on the seed layer 5A. The plating resist pattern 101 includes openings 101A that exposes the seed layer 5A that is located at a portion in which the wiring layer 4B is formed.

Figure 8:
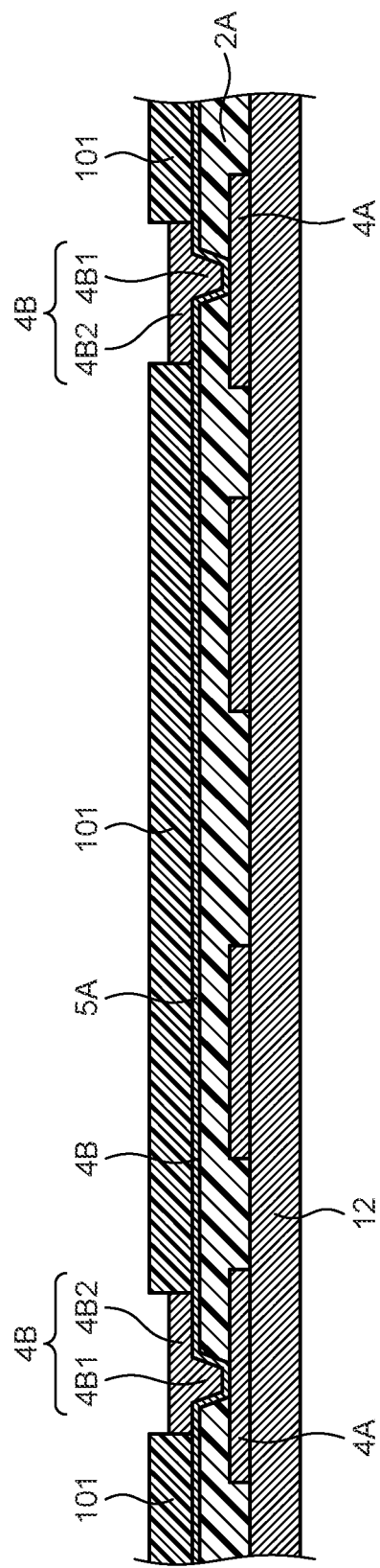
FIG. 8 is a diagram illustrating an example of a first electrolytic plating layer forming step of the built-in component board.

FIG. 8 is a diagram illustrating an example of the first electrolytic plating layer forming step of the built-in component board 1. At the first electrolytic plating layer forming step performed at Step S6, as illustrated in FIG. 8, the wiring layer 4B corresponding to an electrolytic copper plating layer is thus formed on the seed layer 5A that is exposed from the plating resist pattern 101. Specifically, by performing the electrolytic copper plating process using the seed layer 5A as the power supply layer, the wiring layer 4B corresponding to the electrolytic copper plating layer is thus formed on the seed layer 5A that is exposed from the plating resist pattern 101. The electrolytic copper plating layer is formed by filling the opening 21A. The electrolytic copper plating layer filled in the opening 21A serves as a via 4B1 of the wiring layer 4B. The electrolytic copper plating layer formed on the first layer 2A serves as a wiring pattern 4B2 of the wiring layer 4B.

Figure 9:
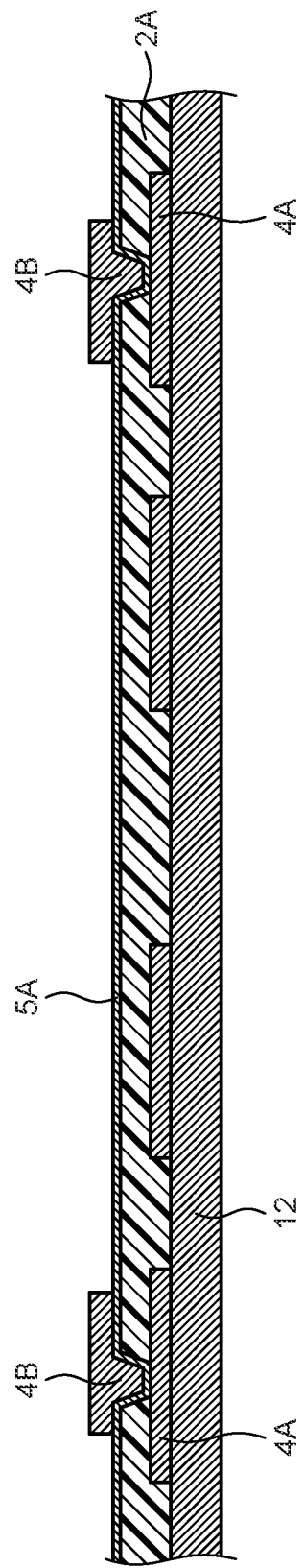
FIG. 9 is a diagram illustrating an example of a first pattern removal step of the built-in component board.

FIG. 9 is a diagram illustrating an example of the first pattern removal step of the built-in component board 1. At the first pattern removal step at Step S7, after having performed the first electrolytic plating layer forming step, for example, as illustrated in FIG. 9, the plating resist pattern 101 is removed from the seed layer 5A by using an amine stripping process. Then, a state in which the seed layer 5A other than a portion overlapped with the wiring layer 4B is exposed is formed.

Figure 10:
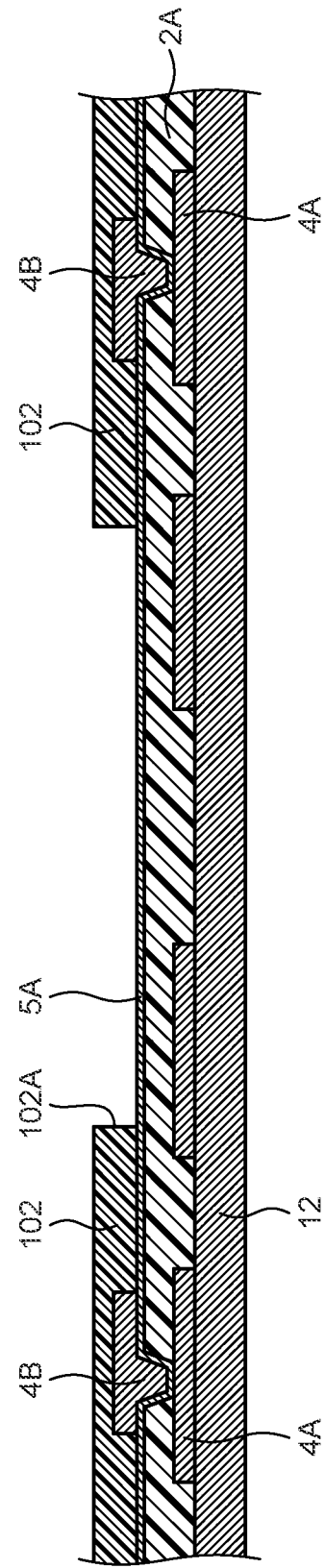
FIG. 10 is a diagram illustrating an example of a second pattern forming step of the built-in component board.

FIG. 10 is a diagram illustrating an example of the second pattern forming step of the built-in component board 1. At the second pattern forming step performed at Step S8, after having performed the first pattern removal step, as illustrated in FIG. 10, a plating resist pattern 102 for forming the metal pad layer 6 on the seed layer 5A is formed. Specifically, for example, by forming the photosensitive resin layer on the seed layer 5A and performing exposure and image development, the plating resist pattern 102 for forming the metal pad layer 6 is thus formed on the seed layer 5A. The plating resist pattern 102 includes an opening 102A from which the seed layer 5A corresponding to a portion in which the metal pad layer 6 is formed.

Figure 11:
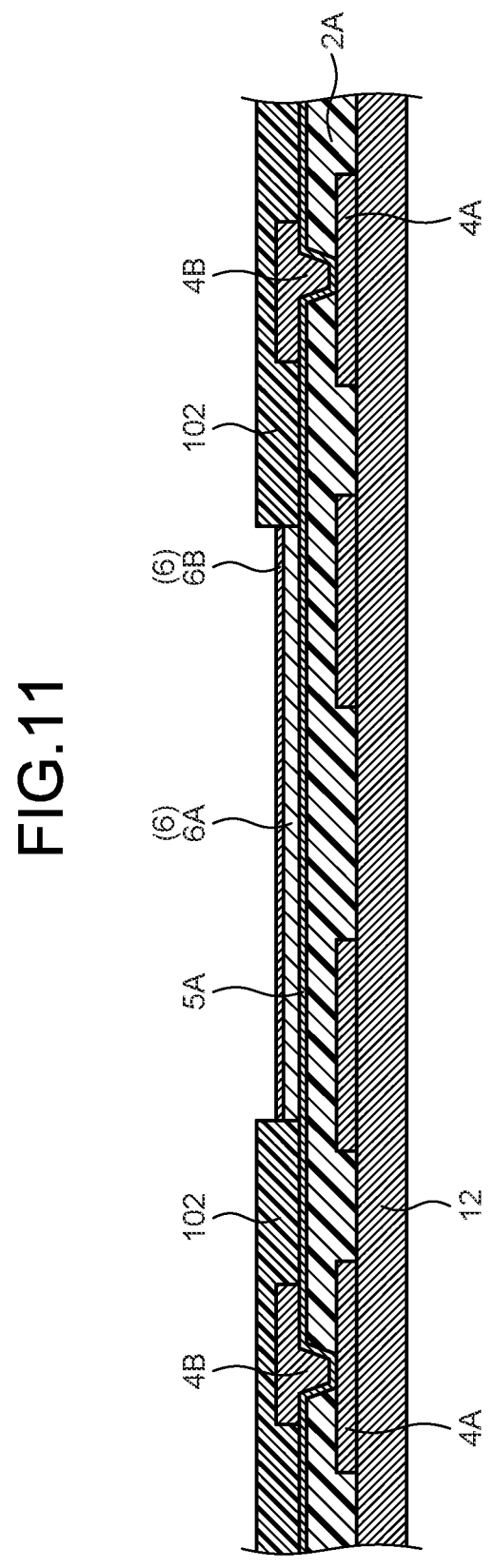

FIG. 11 is a diagram illustrating an example of the second electrolytic plating layer forming step of the built-in component board 1. At the second electrolytic plating layer forming step performed at Step S9, as illustrated in FIG. 11, the metal pad layer 6 is thus formed on the seed layer 5A that is exposed from the plating resist pattern 102. Specifically, an electrolytic nickel plating process is performed by using the seed layer 5A exposed from the plating resist pattern 102 as the power supply layer, the first metal layer 6A formed of nickel is formed on the seed layer 5A that is exposed from the plating resist pattern 102. Furthermore, the second metal layer 6B formed of copper is formed on the first metal layer 6A by performing an electrolytic copper plating process by using the seed layer 5A exposed from the plating resist pattern 102 as the power supply layer. As a result, the metal pad layer 6 is thus formed on the seed layer 5A.

Figure 12:
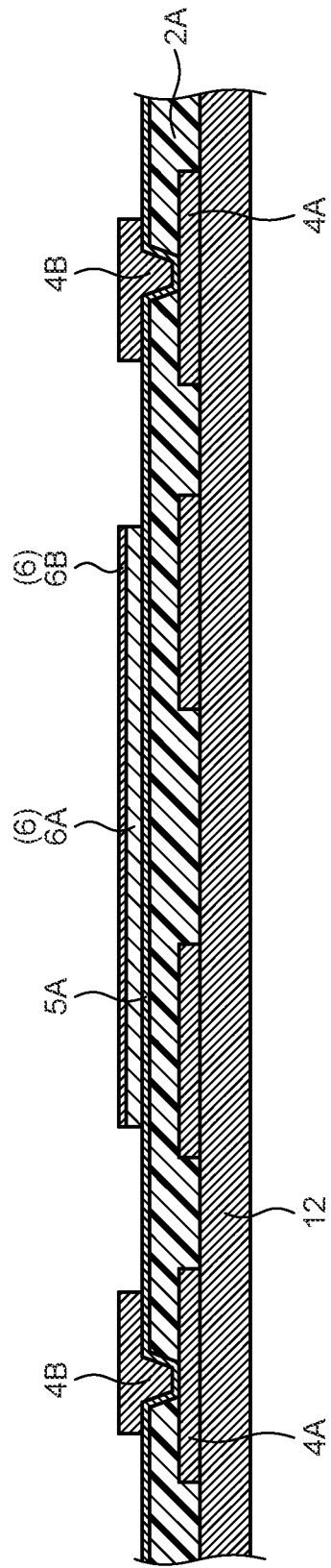
FIG. 12 is a diagram illustrating an example of a second pattern removal step of the built-in component board.

FIG. 12 is a diagram illustrating an example of the second pattern removal step of the built-in component board 1. At the second pattern removal step performed at Step S10, after having performed the second electrolytic plating layer forming step, as illustrated in FIG. 12, the plating resist pattern 102 is removed from the seed layer 5A by using the amine stripping process. Then, a state in which an unneeded portion on the seed layer 5A other than the seed layer 5A located under the wiring layer 4B and the metal pad layer 6 is exposed is formed.

Figure 13:
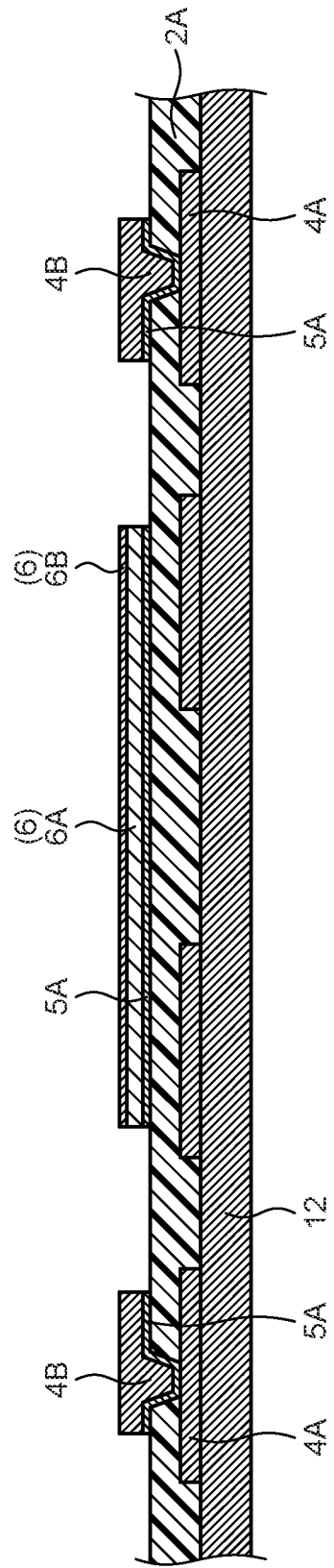
FIG. 13 is a diagram illustrating an example of a seed layer removal step of the built-in component board.

FIG. 13 is a diagram illustrating an example of the seed layer removal step of the built-in component board 1. At the seed layer removal step performed at Step S11, after having performed the second pattern removal step, as illustrated in FIG. 13, the unneeded portion on the seed layer 5A is removed. Specifically, after having performed the second pattern removal step, by removing, by performing an etching process, the unneeded portion on the seed layer 5A other than the seed layer 5A located under the wiring layer 4B and the metal pad layer 6 from the seed layer 5A, the metal pad layer 6 and the wiring layer 4B are thus formed. The seed layer 5A that remains under the metal pad layer 6 and the wiring layer 4B serves as a part of the metal pad layer 6 and a part of the wiring layer 4B.

Figure 14:
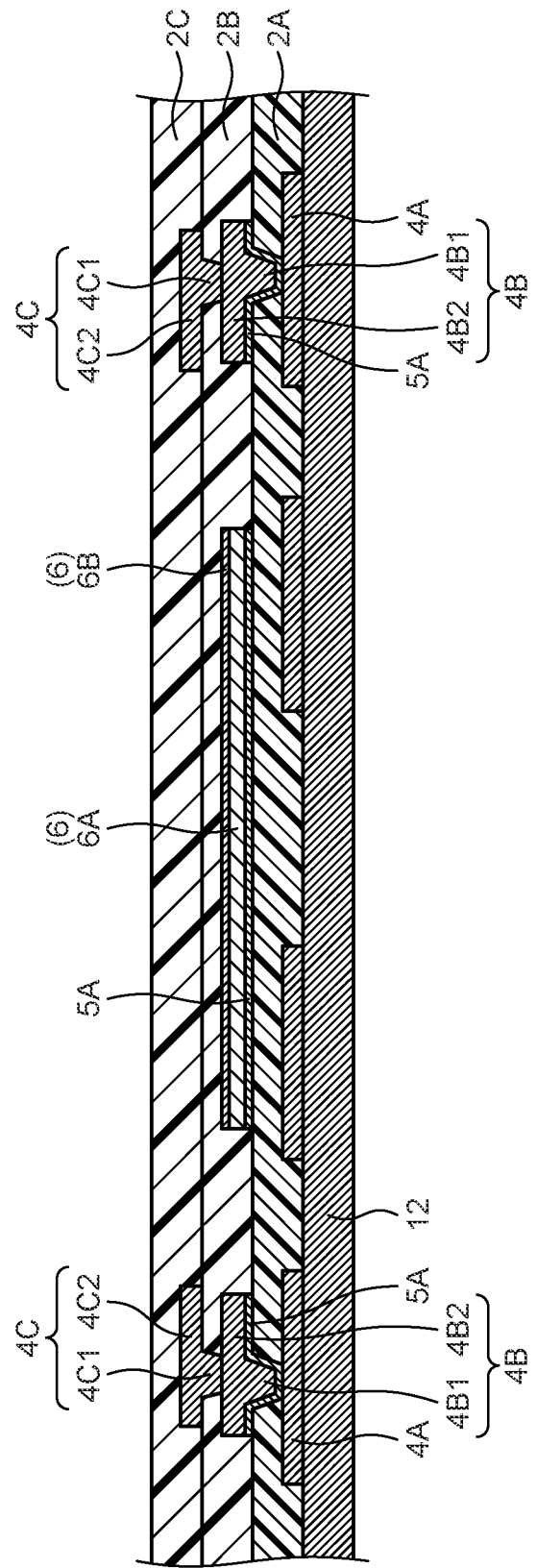
FIG. 14 is a diagram illustrating an example of an insulating layer and wiring layer forming step of the built-in component board.

FIG. 14 is a diagram illustrating an example of the insulating layer and wiring layer forming step of the built-in component board 1. At the insulating layer and wiring layer forming step performed at Step S12, as illustrated in FIG. 14, a needed insulating layer and a needed wiring layer are formed on the first layer 2A. Specifically, after having performed the seed layer removal step, the second layer 2B that is an insulating layer is formed on the first layer 2A by laminating a resin film formed of an epoxy resin, a polyimide resin, or the like. Furthermore, an opening for providing a via is to be formed at a predetermined position on the second layer 2B by performing a process of laser beam machining. Furthermore, as a result, the opening formed on the second layer 2B exposes a part of the wiring layer 4B that is a lower layer. Furthermore, the opening is formed in an inverted truncated cone shape having a larger diameter on the surface side of the second layer 2B than a diameter on the surface side from which the wiring layer 4B is exposed.

Furthermore, by using a semi-additive process, the wiring layer 4C is to be formed at a predetermined portion on the second layer 2B. Furthermore, the wiring layer 4C is formed by using the same manufacturing method as that used for forming the wiring layer 4B. Specifically, by performing, for example, an electroless copper plating process on the second layer 2B, seed layer that has been subjected to electroless copper plating is thus formed. At this time, the seed layer that has been subjected to electroless copper plating are also thus formed on the inner wall of the opening and the surface of the wiring layer 4B that is exposed from the opening. Furthermore, for example, by forming the photosensitive resin layer on the seed layer and performing exposure and image development, a plating resist pattern is thus formed on the seed layer. The plating resist pattern includes an opening that exposes the seed layer corresponding to a portion in which the wiring layer 4C is formed. Furthermore, by performing the electrolytic copper plating process by using the seed layer as a power supply layer, the wiring layer 4C that corresponds to an electrolytic copper plating layer is thus formed on the seed layer that is exposed from the plating resist pattern. At this time, the electrolytic copper plating layer is formed by filling inside the opening. The electrolytic copper plating layer filled in the opening serves as a via 4C1 of the wiring layer 4C. The electrolytic copper plating layer formed on the second layer 2B serves as the wiring pattern 4C2 of the wiring layer 4C. Then, the plating resist pattern is removed from the seed layer by using, for example, an amine stripping process. Then, a state in which the seed layer other than the wiring layer 4C is exposed is formed. Furthermore, and by removing, by performing an etching process, the unneeded portion on the seed layer other than the seed layer located under the wiring layer 4C is removed from the seed layer, the wiring layer 4C is thus formed. The seed layer remaining below the wiring layer 4C serves as a part of the wiring layer 4C. Furthermore, for convenience of description, illustration of the seed layer remaining below the wiring layer 4C is omitted. Then, the third layer 2C corresponding to an insulating layer is to be formed on the second layer 2B by laminating a resin film formed of an epoxy resin, a polyimide resin, or the like.

Figure 15:
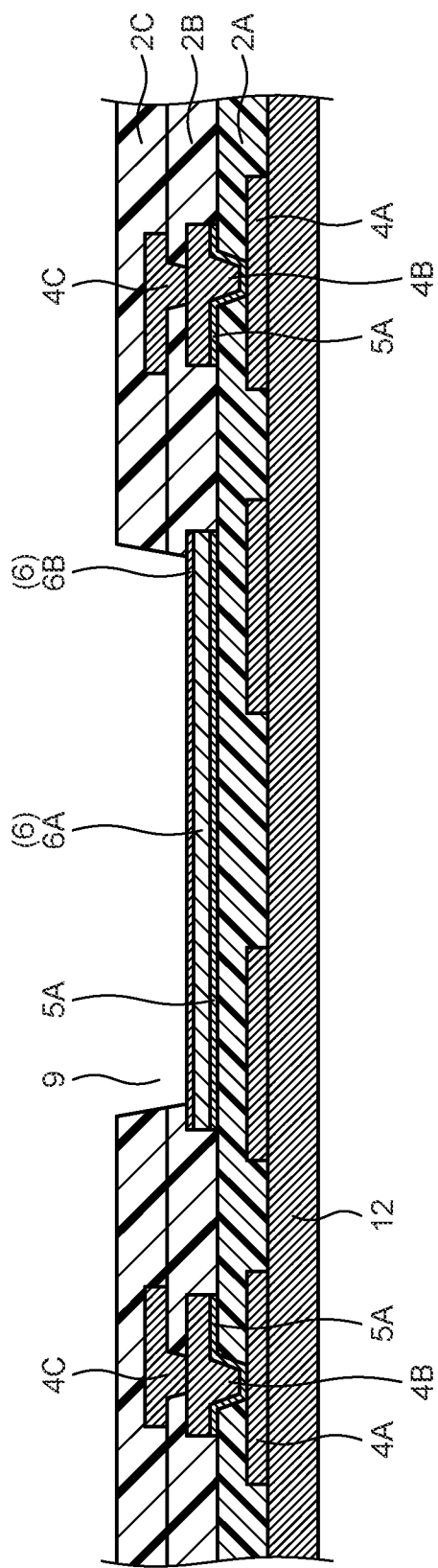
FIG. 15 is a diagram illustrating an example of a cavity forming step of the built-in component board.

FIG. 15 is a diagram illustrating an example of the cavity forming step of the built-in component board 1. At the cavity forming step performed at Step S13, after having performed the insulating layer and wiring layer forming step, as illustrated in FIG. 15, the cavity 9 is formed in the second layer 2B and the third layer 2C. Specifically, a process of laser beam machining is performed on each of the third layer 2C and the second layer 2B from the third layer 2C toward the metal pad layer 6 included in the second layer 2B, so that the cavity 9 is thus formed in the second layer 2B and the third layer 2C. The cavity 9 is formed by passing through each of the second layer 2B and the third layer 2C. The metal pad layer 6 is exposed on the bottom surface of the cavity 9. At this time, the temperature of the second metal layer 6B on the metal pad layer 6 in the cavity 9 is increased due to processing heat generated at the time of the process of laser beam machining; however, the first metal layer 6A that corresponds to a lower surface of the second metal layer 6B suppresses propagation of the processing heat to the insulating resin layer that forms the first layer 2A. Furthermore, it is possible to suppress a change in quality, due to the processing heat, of the interfacial surface of the insulating resin layer that forms the first layer 2A located on the lower surface of the seed layer 5A that is under the second metal layer 6B. As a result, it is possible to suppress a decrease in a sticking force between the metal pad layer 6 and the insulating resin layer that forms the first layer 2A.

Figure 16:
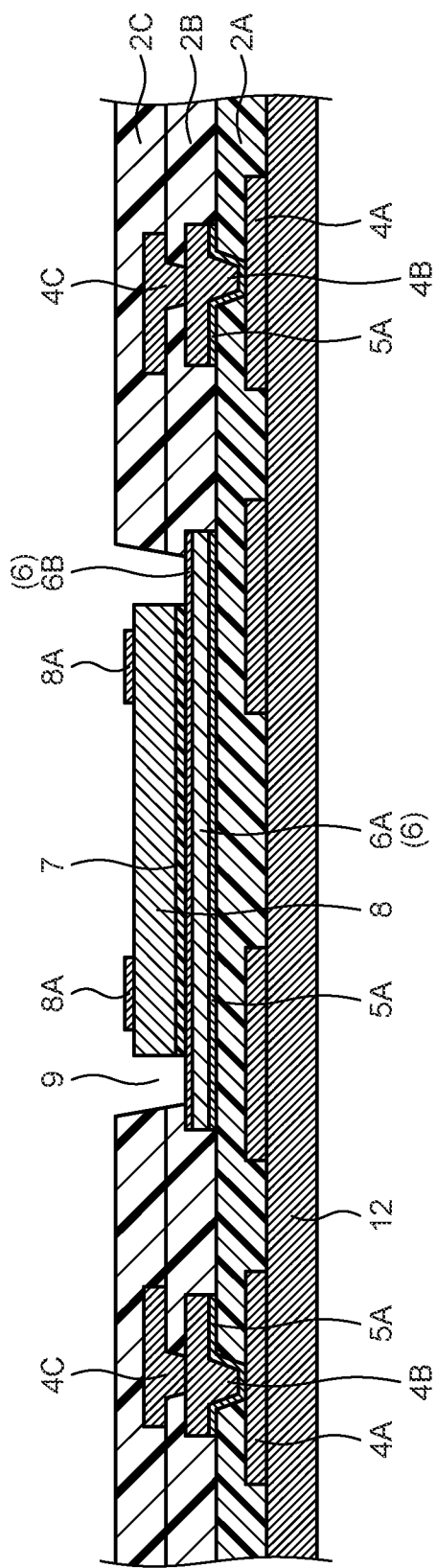
FIG. 16 is a diagram illustrating an example of a component arrangement step of the built-in component board.

FIG. 16 is a diagram illustrating an example of the component arrangement step of the built-in component board 1. At the component arrangement step performed at Step S14, as illustrated in FIG. 16, the electronic component 8 is arranged in the cavity 9 that is formed in the second layer 2B and the third layer 2C. Specifically, the electronic component 8 to which the adhesive material 7 is adhered to the bottom surface is prepared. Then, the electronic component 8 is arranged on the second metal layer 6B included in the metal pad layer 6 inside the cavity 9 is arranged by way of the adhesive material 7. After that, the electronic component 8 is heated while performing vacuum suction in a state in which the electronic component 8 is lightly pressed. Then, the adhesive material 7 is made to a semi cured state with no curing and shrinkage, and then, the electronic component 8 is temporarily fixed onto the second metal layer 6B inside the cavity 9.

Figure 17:
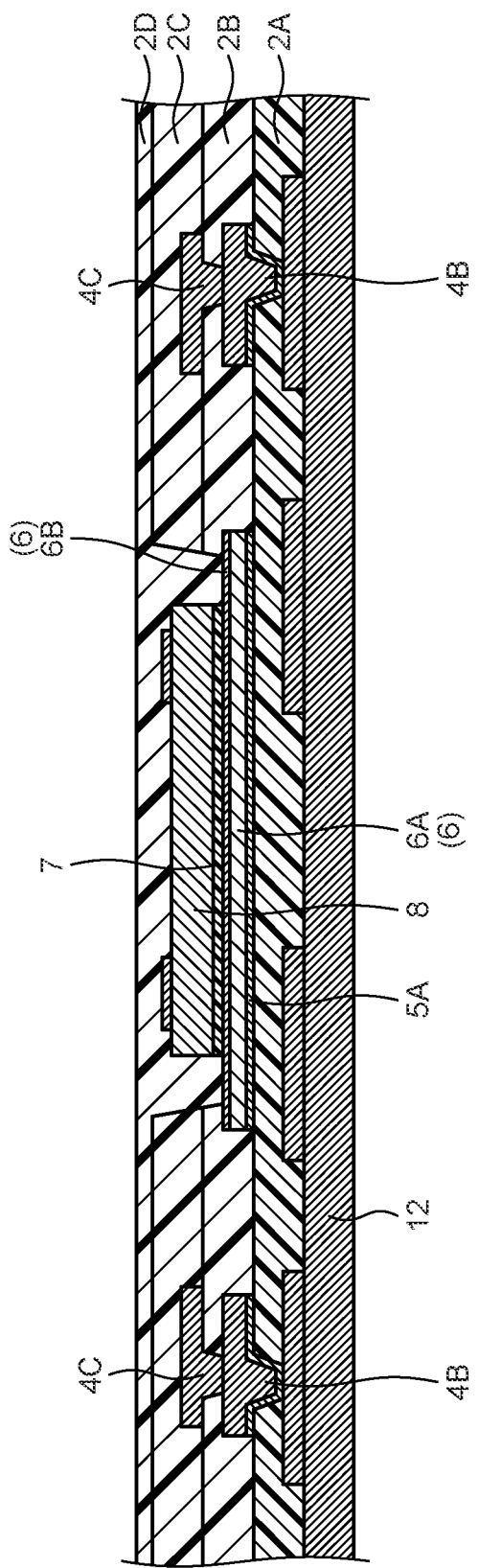
FIG. 17 is a diagram illustrating an example of a filling step of the built-in component board.

FIG. 17 is a diagram illustrating an example of the filling step of the built-in component board 1. At the filling step performed at Step S15, as illustrated in FIG. 17, the filling layer 2D is formed by filling a resin in the cavity 9 in which the electronic component 8 is arranged. Specifically, after having performed the component arrangement step, the filling layer 2D is formed on the third layer 2C and in the space in the cavity 9 by laminating a resin film formed of an epoxy resin, a polyimide resin, or the like on the third layer 2C. At this time, a thermal curing process is performed on the filling resin that is filled in the space in the cavity 9 and the adhesive material 7 that is located between the second metal layer 6B and the electronic component 8. As a result, a portion between the second metal layer 6B and the electronic component 8 is fixed by the adhesive material 7, and the electronic component 8 located in the cavity 9 is buried by the filling layer 2D. In the thermal curing process performed on the filling resin and the adhesive material 7, stress acting on the electronic component 8 that suffers warping into a convex shape is generated due to thermal curing and shrinkage of the adhesive material 7. Then, the subject stress acts on the interfacial surface between the metal pad layer 6 and the insulating resin layer that forms the first layer 2A. In this case, also, it is possible to prevent deformation of the metal pad layer 6 on the basis of the quality of the material of the first metal layer 6A that has a high elastic modulus. Accordingly, it is possible to prevent an occurrence of stress between the metal pad layer 6 and the first layer 2A, and it is thus possible to suppress delamination from being generated between the metal pad layer 6 and the first layer 2A. Furthermore, a reduction in a warp of the electronic component can be expected by suppressing the delamination from being generated.

Figure 18:
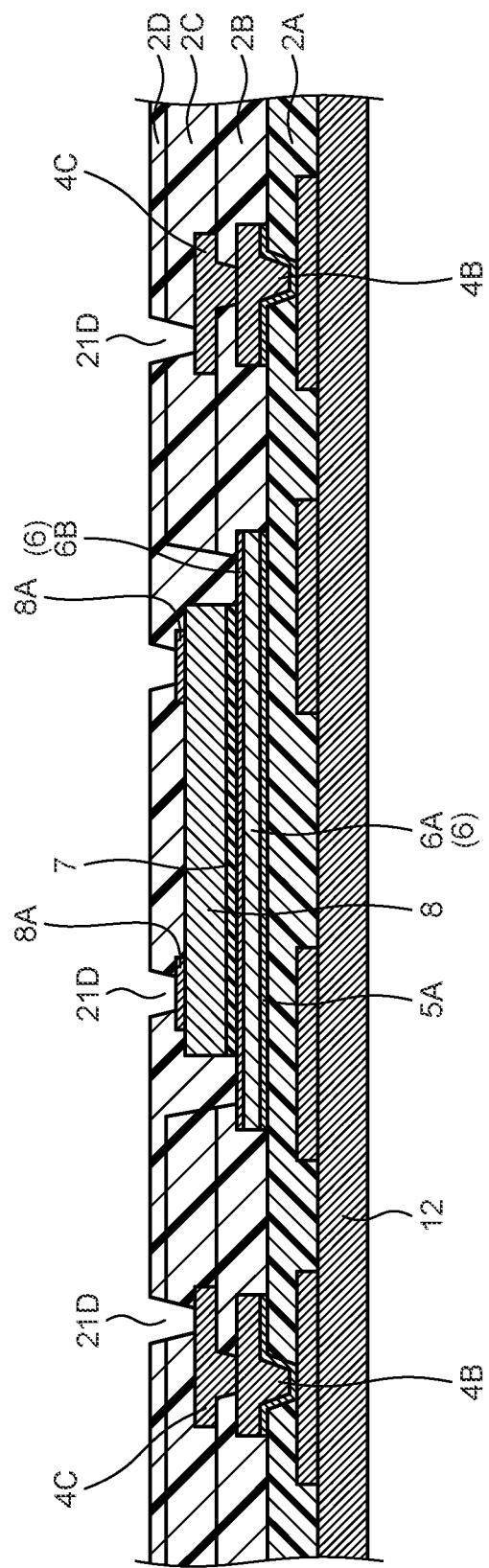
FIG. 18 is a diagram illustrating an example of a second opening forming step of the built-in component board.

FIG. 18 is a diagram illustrating an example of the second opening forming step of the built-in component board 1. At the second opening forming step performed at Step S16, after having performed the filling step, as illustrated in FIG. 18, openings 21D are formed in the filling layer 2D. Specifically, each of the openings 21D are formed at a predetermined position of the filling layer 2D by performing a process of laser beam machining. Each of the openings 21D formed on the filling layer 2D exposes a part of the electrode 8A of the electronic component 8. At the second opening forming step, the opening 21D that integrally passes through the insulating resin layers that form the filling layer 2D and the third layer 2C is also formed. Each of the openings 21D is formed at a predetermined position of the insulating resin layer that forms each of the filling layer 2D and the third layer 2C. The opening 21D exposes a part of the wiring layer 4C. Furthermore, the opening 21D is formed in an inverted truncated cone shape having a larger diameter on the surface side of the filling layer 2D than the diameter on the surface side from which the wiring layer 4C is exposed.

Figure 19:
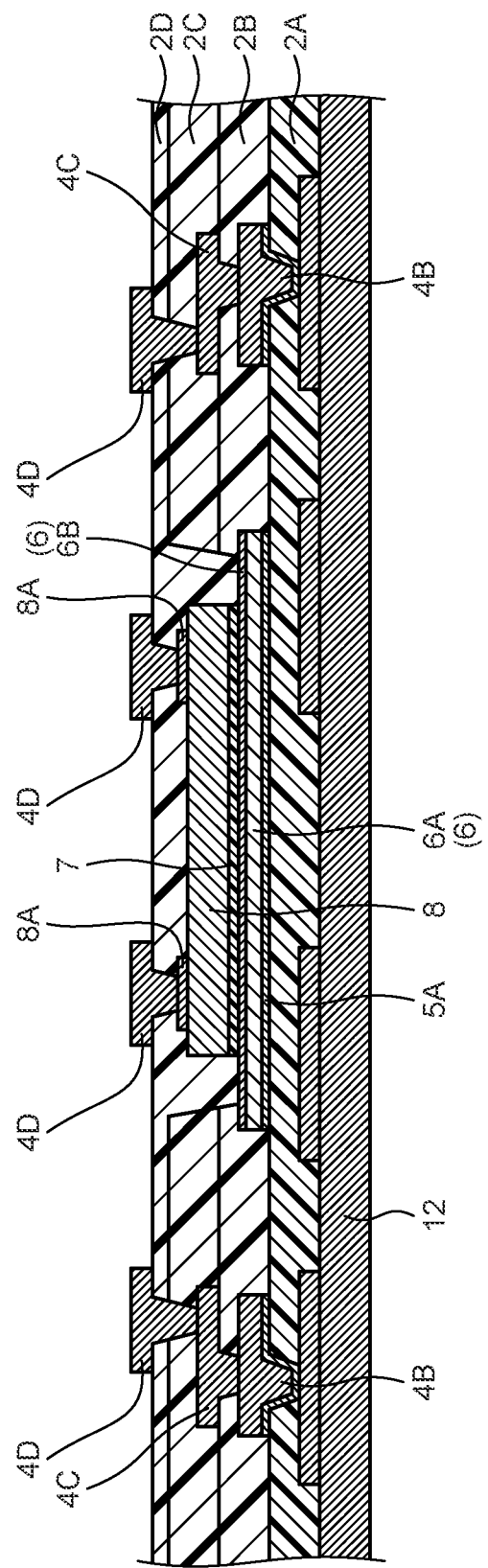
FIG. 19 is a diagram illustrating an example of a second wiring layer forming step of the built-in component board.

FIG. 19 is a diagram illustrating an example of the second wiring layer forming step of the built-in component board 1. At the second wiring layer forming step performed at Step S17, after having performed the second opening forming step, as illustrated in FIG. 19, the wiring layer 4D is formed on the filling layer 2D. Furthermore, it is assumed that the wiring layer 4D is formed by using the same manufacturing method as that used for forming, for example, the wiring layer 4B and the wiring layer 4C. Specifically, for example, by using the semi-additive process, the wiring pattern of the wiring layer 4D is thus formed on the filling layer 2D, and also, a via of the wiring layer 4D is thus formed in the opening 21D that is formed on the filling layer 2D. The wiring layer 4D is a wiring layer that is used to connect to an insulating layer located in the lower layer, for example, the wiring layer 4C included in the third layer 2C, or a wiring layer that is used to connect to the electrode 8A of the electronic component 8 buried in the cavity 9.

Figure 20:
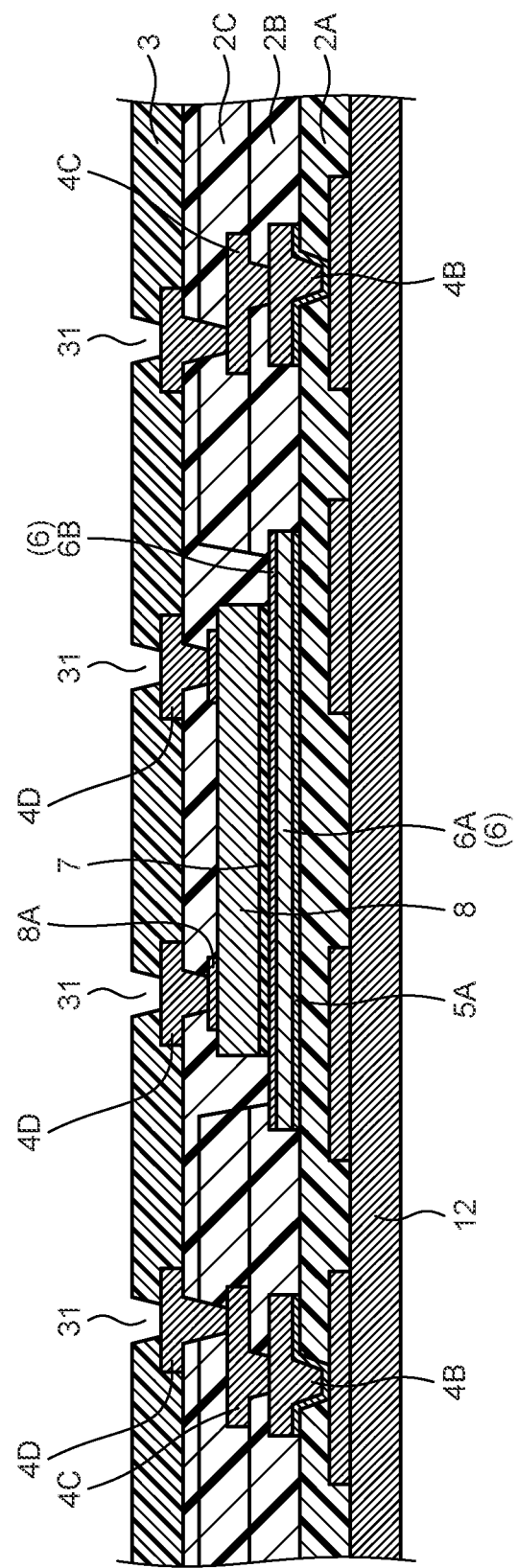
FIG. 20 is a diagram illustrating an example of a solder resist layer forming step of the built-in component board.

FIG. 20 is a diagram illustrating an example of the solder resist layer forming step of the built-in component board 1. At the solder resist layer forming step performed at Step S18, as illustrated in FIG. 20, the solder resist layer 3 is formed on the filling layer 2D. Specifically, the solder resist layer 3 is formed by laminating a resin film formed of an epoxy resin, a polyimide resin, or the like on the filling layer 2D. Furthermore, an opening 31 is to be formed in the solder resist layer 3 such that the wiring layer 4D is exposed by performing a process of laser beam machining. Furthermore, the opening 31 is formed in an inverted truncated cone shape having a larger diameter on the surface side of the solder resist layer 3 than a diameter on the surface side from which the wiring layer 4D exposes.

Figure 21:
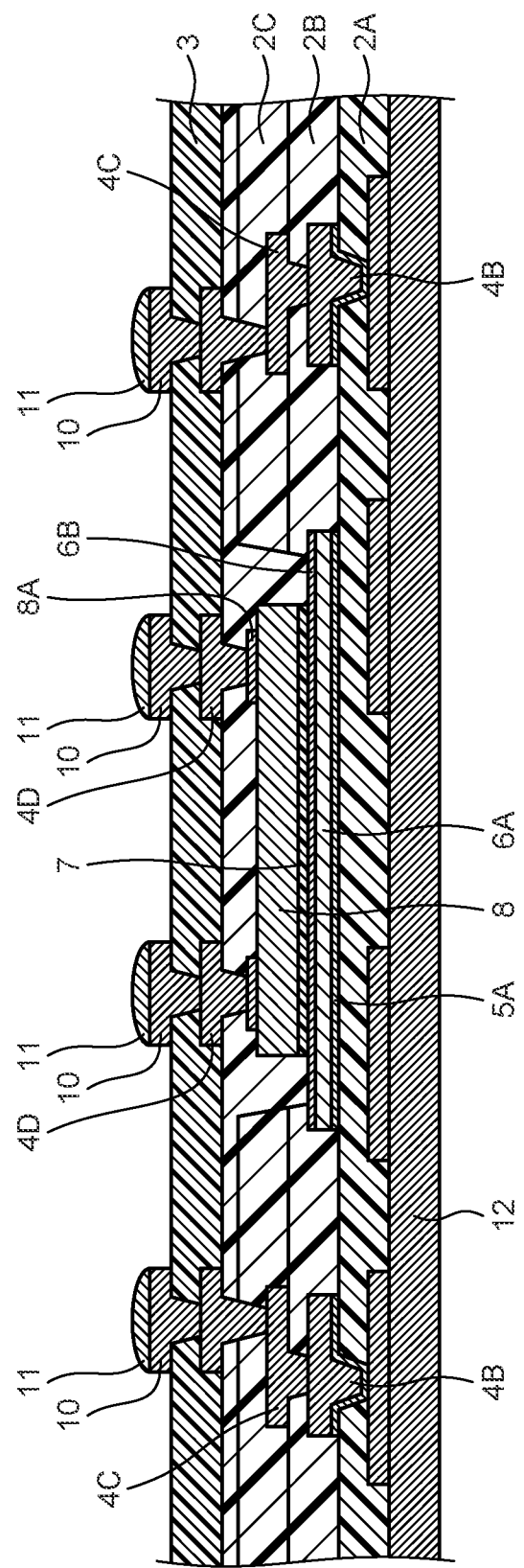
FIG. 21 is a diagram illustrating an example of a connecting terminal forming step of the built-in component board.

FIG. 21 is a diagram illustrating an example of the connecting terminal forming step of the built-in component board 1. At the connecting terminal forming step performed at Step S19, after having performed the solder resist layer forming step, as illustrated in FIG. 21, the connecting terminals 10 are formed in the respective openings 31 that are formed in the solder resist layer 3. Furthermore, it is assumed that the connecting terminals 10 are formed by using the same manufacturing method as that used to form, for example, the wiring layer 4B and the wiring layer 4C. Specifically, for example, by performing the semi-additive process, the connecting terminals 10 are formed in the respective openings 31 that are formed in the solder resist layer 3, and also, a tin plating layer or a solder plating layer is formed on the upper surface of the connecting terminals 10. Subsequently, by performing a reflow process, the tin plating layer or the solder plating layer is melted. As a result, the bump 11 is formed on the upper surface of each of the connecting terminals 10.

Figure 22:
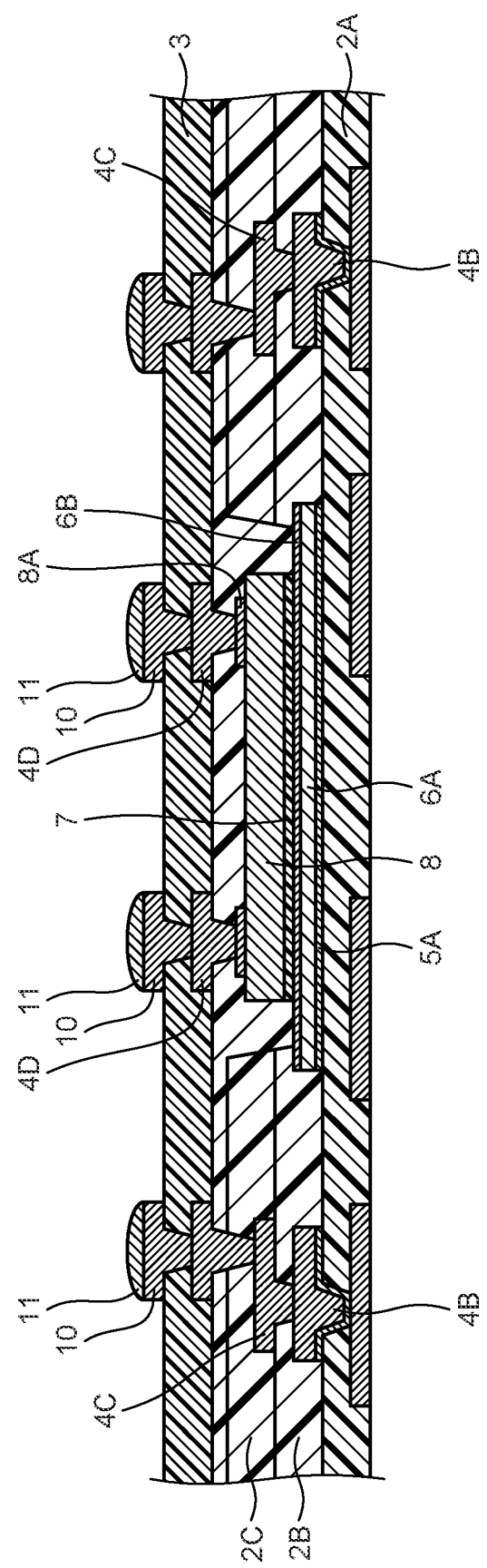
FIG. 22 is a diagram illustrating an example of a support medium removal step of the built-in component board.

FIG. 22 is a diagram illustrating an example of the support medium removal step of the built-in component board 1. At the support medium removal step performed at Step S20, as illustrated in FIG. 22, the support medium 12 is removed from the lower surface of the first layer 2A by performing the etching process.

Figure 23:
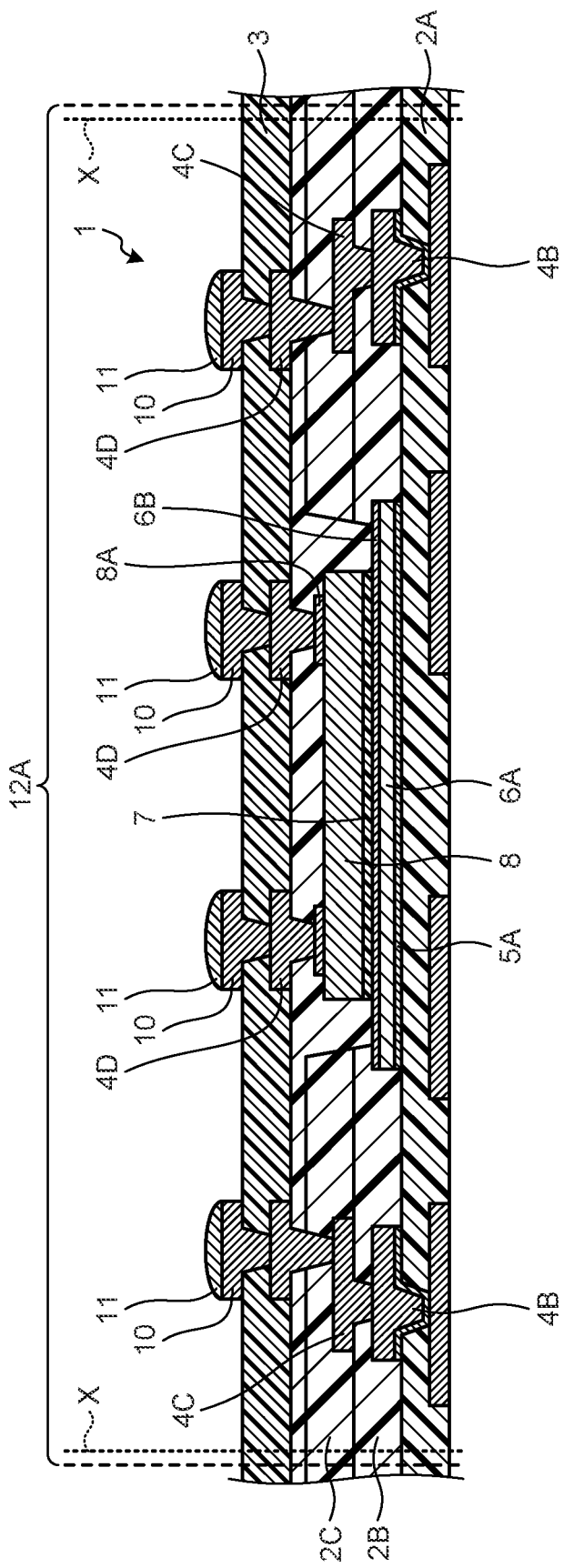
FIG. 23 is a diagram illustrating an example of a board cutting process of the built-in component board.
Figure 24:
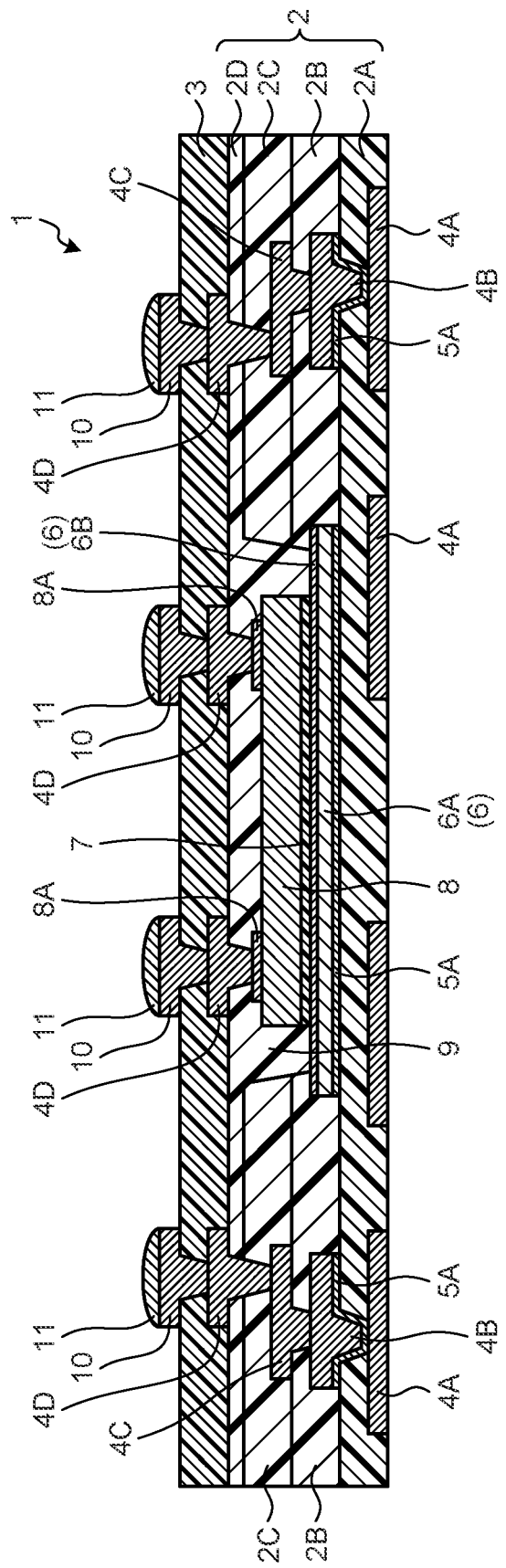
FIG. 24 is a diagram illustrating an example of a finished product of a built-in component board.

FIG. 23 is a diagram illustrating an example of the board cutting process of the built-in component board 1, and FIG. 24 is a diagram illustrating an example of the built-in component board 1 that has been completed. At the board cutting process performed at Step S21, as illustrated in FIG. 23, by cutting the built-in component board 1 at a cutting line X located on the inner side of each of the built-in component board forming areas 12A at the time of performing a cutting process and by cutting the build-up layer 2 and the solder resist layer 3 located between the built-in component board forming area 12A, the plurality of built-in component boards 1, which has been completed, illustrated in FIG. 24 are obtained.

Figure 25:
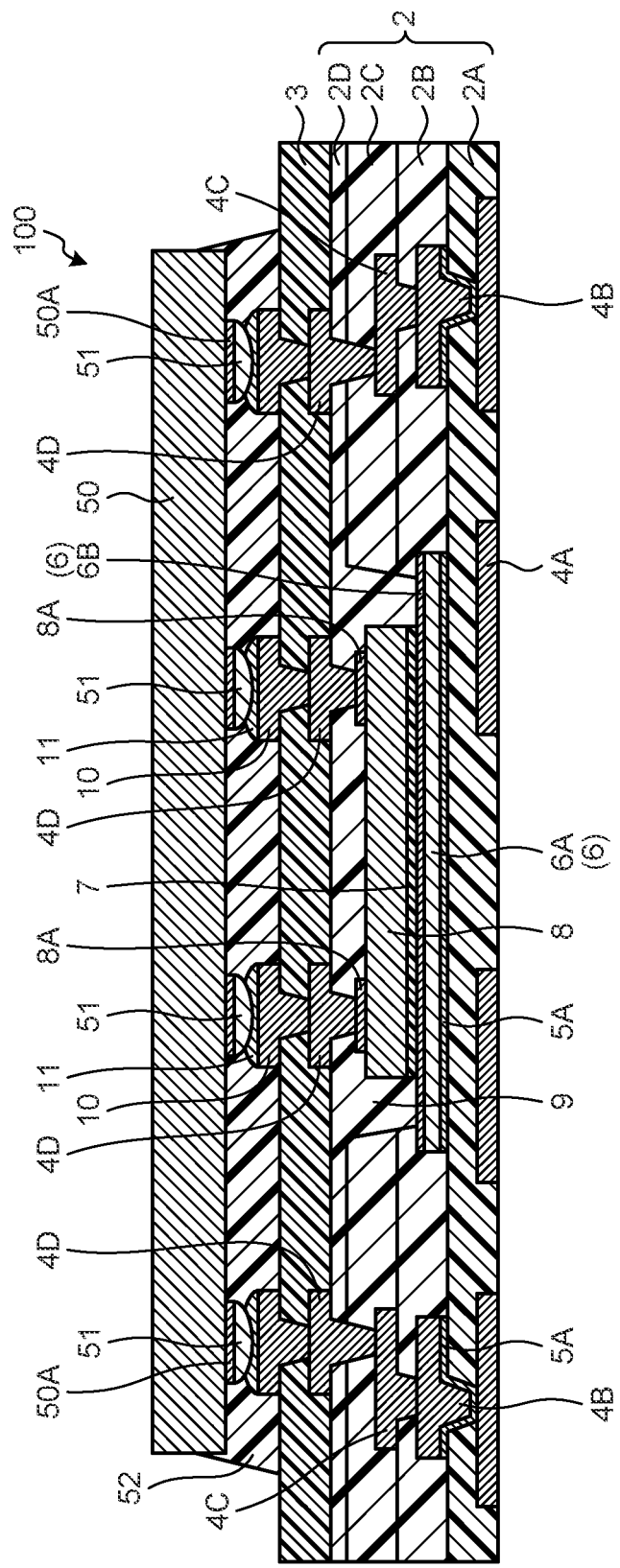
FIG. 25 is a diagram illustrating an example of a semiconductor device.

FIG. 25 is a diagram illustrating an example of a semiconductor device 100. The semiconductor device 100 illustrated in FIG. 25 is constituted by mounting the semiconductor chip 50 on the built-in component board 1 that is illustrated in FIG. 24. An electrode 50A on the lower surface of the semiconductor chip 50 is bonded to the connecting terminal 10 by using solder 51 or the like.

Furthermore, a bonding portion between the electrode 50A of the semiconductor chip 50 and the connecting terminal 10 on the built-in component board 1 is encapsulaterd by an underfill resin 52, and the semiconductor device 100 in which the semiconductor chip 50 is mounted on the built-in component board 1 is obtained.

Figure 26:
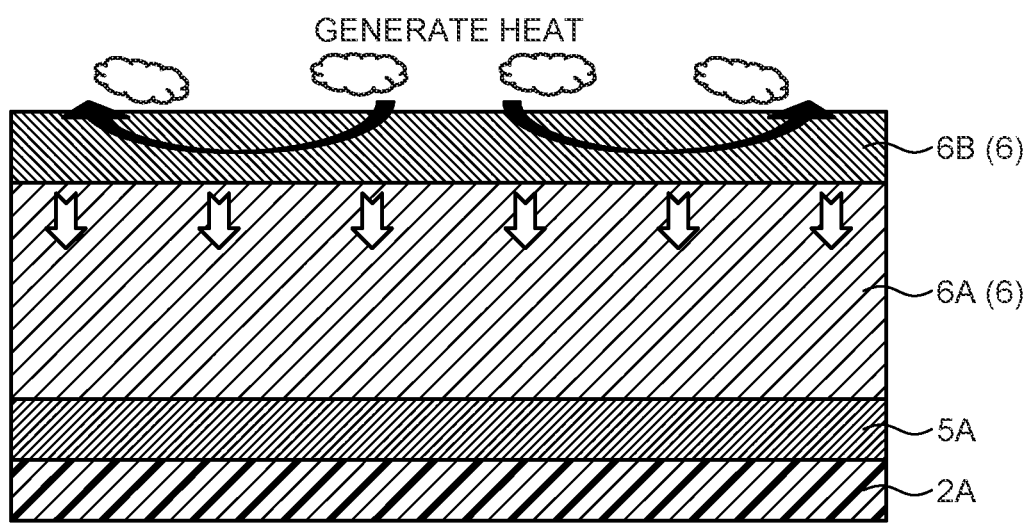
FIG. 26 is a diagram illustrating an example of a metal pad layer included in the built-in component board.

FIG. 26 is a diagram illustrating an example of the metal pad layer 6 in the built-in component board 1. The metal pad layer 6 illustrated in FIG. 26 includes the first metal layer 6A that is formed of nickel and that is formed on the seed layer 5A in the cavity 9, the second metal layer 6B that is formed of copper and that is formed on the first metal layer 6A. A metal that has been subjected to copper plating is a metal that has high thermal conductivity, that has a high sticking force with an insulating resin, and that has a high laser reflectance in a process of laser beam machining. In contrast, nickel is a metal that has lower thermal conductivity and a higher elastic modulus than those of copper. In the metal pad layer 6, the temperature of the second metal layer 6B is increased at the time of cavity forming step caused by processing heat generated due to the process of laser beam machining. However, it is possible to suppress propagation of the processing heat to the insulating resin layer by using the first metal layer 6A located between the second metal layer 6B and the insulating resin layer that is included in the first layer 2A. As a result, it is possible to suppress a change in quality of the interfacial surface of the insulating resin layer that is included in the first layer 2A caused by the processing heat generated at the time of the cavity forming step.

Figure 27:
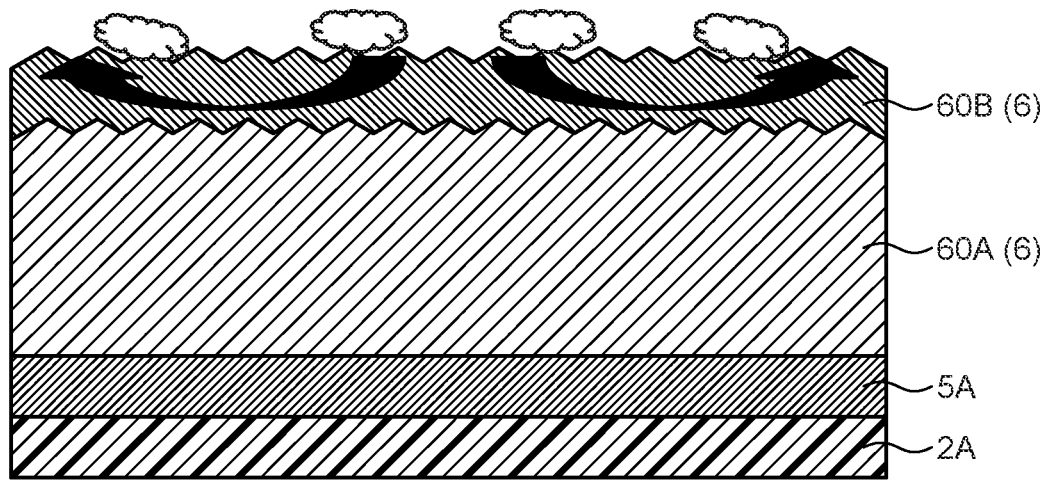
FIG. 27 is a diagram illustrating an example of another metal pad layer.

In addition, as the metal pad layer 6 included in the built-in component board 1 according to the first embodiment, a double structured metal pad layer that includes the first metal layer 6A formed of nickel and the second metal layer 6B formed of copper has been exemplified; however, an example is not limited to this. FIG. 27 is a diagram illustrating another example of the metal pad layer 6. The metal pad layer 6 illustrated in FIG. 27 includes a first metal layer 60A that has been subjected to roughened nickel plating and a second metal layer 60B that has been subjected to copper plating. The degree of roughness of copper plating of the second metal layer 60B is increased in accordance with the degree of roughness of roughened nickel plating of the first metal layer 60A. Furthermore, the degree of roughness (surface roughness) of nickel plating is, for example, Ra=100 to 300 nm. By increasing the degree of roughness, the surface area of the second metal layer 60B is increased, so that thermal emittance at the time of the cavity forming step performed in the process of laser beam machining. Then, it is possible to suppress propagation of processing heat to the insulating resin layer by using the first metal layer 60A that is located between the second metal layer 60B and the insulating resin layer that is included in the first layer 2A. As a result, it is possible to suppress a change in quality of the interfacial surface of the insulating resin layer included in the first layer 2A caused by the processing heat generated at the time of the cavity forming step. In addition, it is possible to suppress a decrease in a sticking force between the metal pad layer 6 and the insulating resin layer that is included in the first layer 2A.

Figure 28A:
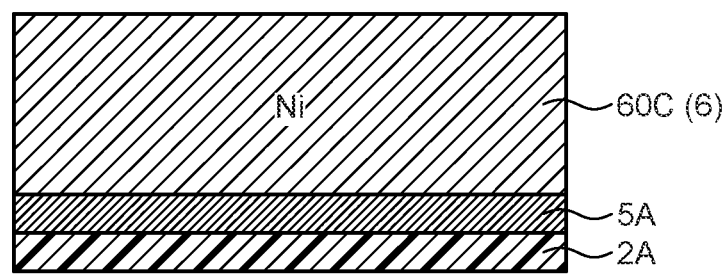
FIG. 28A is a diagram illustrating an example of another metal pad layer.

FIG. 28A is a diagram illustrating another example of the metal pad layer 6. The metal pad layer 6 illustrated in FIG. 28A may be constituted by forming a single piece of a metal layer 60C, which is formed of nickel, on the seed layer 5A in the cavity 9, instead of using a double structure. As described above, the quality of the material of the metal layer 60C formed of nickel has a lower thermal conductivity than that of copper; therefore, it is possible to suppress propagation of processing heat to the insulating resin layer that is included in the first layer 2A by using the metal layer 60C. As a result, it is possible to suppress a change in quality of the interfacial surface of the insulating resin layer that is included in the first layer 2A caused by the processing heat generated at the time of the cavity forming step. In addition, it is possible to suppress a decrease in a sticking force between the metal pad layer 6 and the insulating resin layer that is included in the first layer 2A.

Figure 28B:
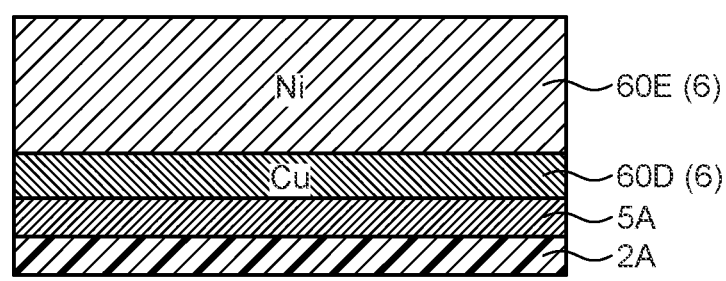
FIG. 28B is a diagram illustrating an example of another metal pad layer.

FIG. 28B is a diagram illustrating another example of the metal pad layer 6. The metal pad layer 6 illustrated in FIG. 28B includes a first metal layer 60D that is formed of copper and that is formed on the seed layer 5A in the cavity 9, and a second metal layer 60E that is formed of nickel and that is formed on the first metal layer 60D. The second metal layer 60E is formed of nickel, so that it is possible to suppress propagation of processing heat to the insulating resin layer that is included in the first layer 2A by using the second metal layer 60E. As a result, it is possible to suppress a change in quality of the interfacial surface of the insulating resin layer that is included in the first layer 2A caused by the processing heat generated at the time of the cavity forming step. In addition, it is possible to suppress a decrease in a sticking force between the metal pad layer 6 and the insulating resin layer that is included in the first layer 2A.

Furthermore, a case has been described as one example in which, the metal pad layer 6 according to the present embodiment is constituted by a single structured or a double structured metal layer that includes at least a metal layer having, as the quality of material, thermal conductivity that is lower than thermal conductivity of copper. However, for example, the structure of the metal layer may be constituted by a triple or more structured layer, and appropriate modifications are possible as long as at least one or more layer having thermal conductivity that is lower than thermal conductivity of copper is used.

The built-in component board 1 according to the present embodiment includes the first layer 2A, the wiring layer 4A and the metal pad layer 6 that are formed on the first layer 2A, the second layer 2B that is formed on the wiring layer 4A and the metal pad layer 6, and the cavity 9 that is formed in the second layer 2B and that exposes the metal pad layer 6. Furthermore, the built-in component board 1 includes the electronic component 8 that is mounted on the metal pad layer 6, and the filling layer 2D that is filled in the cavity 9 and that buries therein the electronic component 8. Furthermore, the metal used for the metal pad layer 6 includes a metal having thermal conductivity that is lower than thermal conductivity of a metal that is used for the wiring layer 4A. As a result, by suppressing a change in quality of the interfacial surface of the insulating resin layer that is included in the first layer 2A caused by the processing heat generated at the time of the cavity forming step, it is possible to suppress a decrease in a sticking force between the metal pad layer 6 and the insulating resin layer that is included in the first layer 2A. In other words, it is possible to prevent the metal pad layer 6 from being stripped from the insulating resin layer that is included in the first layer 2A.

The built-in component board 1 is formed on the first layer 2A that is located in the cavity 9 formed at a predetermined portion of the second layer 2B, and further includes the metal pad layer 6 that includes a metal layer having the thermal conductivity that is lower than the thermal conductivity of copper as the quality of the material. The built-in component board 1 includes the electronic component 8 that is connected to the metal pad layer 6 in the cavity 9 through the adhesive material 7, and the filling layer 2D that buries the electronic component 8 in the cavity 9. As a result, by suppressing a change in quality of the interfacial surface of the insulating resin layer that is included in the first layer 2A caused by the processing heat generated at the time of the cavity forming step, it is possible to suppress a decrease in a sticking force between the metal pad layer 6 and the insulating resin layer that is included in the first layer 2A. In other words, it is possible to prevent the metal pad layer 6 from being stripped from the insulating resin layer that is included in the first layer 2A.

The metal pad layer 6 includes the first metal layer 6A that has the thermal conductivity that is lower than the thermal conductivity of copper as the quality of the material, and the second metal layer 6B that is formed of copper, that is formed on the first metal layer 6A, and that is connected to the electronic component 8 through the adhesive material 7. It is possible to suppress propagation of the processing heat generated at the time of the cavity forming step by using the first metal layer 6A that is arranged between the second metal layer 6B and the first layer 2A. As a result, it is possible to suppress a change in quality of the interfacial surface of the insulating resin layer that is included in the first layer 2A caused by the processing heat generated at the time of the cavity forming step. In addition, it is possible to suppress a decrease in a sticking force between the metal pad layer 6 and the insulating resin layer that is included in the first layer 2A.

The metal pad layer 6 is formed on the seed layer 5A corresponding to the electroless copper plating layer that is laminated on the first layer 2A located in the cavity 9. As a result, it is possible to suppress a change in quality of the interfacial surface of the insulating resin layer that is included in the first layer 2A located under the seed layer 5A caused by the processing heat, and it is thus possible to suppress a decrease in a sticking force between the metal pad layer 6 and the insulating resin layer that is included in the first layer 2A.

The first metal layer 6A has an elastic modulus that is higher than that of copper that is used for the electrolytic copper plating layer and that is the main material of the wiring layer as the quality of the material. As a result, in the thermal curing process of completely curing the filling resin and the adhesive material 7, even if stress generated caused by thermal curing and shrinkage of the adhesive material 7 acts on the interfacial surface of the metal pad layer 6 or the insulating resin layer that is included in the first layer 2A, it is possible to suppress an occurrence of delamination due to stress occurred caused by the first metal layer 6A.

As the method of manufacturing the built-in component board 1, the metal pad layer 6 that includes a metal layer formed of a material having thermal conductivity that is higher than thermal conductivity of copper is formed at a predetermined portion on the first layer 2A, and the second layer 2B is laminated on the first layer 2A. Furthermore, as the manufacturing method, the cavity 9 is formed at a predetermined portion on the second layer 2B and the third layer 2C such that the surface of the metal pad layer 6 is exposed by performing a process of laser beam machining, and then, the electronic component 8 is arranged on the metal pad layer 6 that is located in the cavity 9 through the adhesive material 7. Furthermore, as the manufacturing method, the electronic component 8 is buried in the cavity 9 by filling the filling resin in the cavity 9 and performing the thermal curing process on the adhesive material 7 and the filling resin. As a result, it is possible to suppress propagation of the processing heat generated at the time of the cavity forming step by using the metal pad layer 6. Furthermore, by suppressing a change in quality of the interfacial surface of the insulating resin layer that is included in the first layer 2A caused by the processing heat, it is possible to suppress a reduction in a sticking force between the metal pad layer 6 and the insulating resin layer that is included in the first layer 2A.

As a step of forming the metal pad layer 6, after having formed the first metal layer 6A, which is formed of a material having lower thermal conductivity than coper, on the first layer 2A, the second metal layer 6B made of copper is formed on the first metal layer 6A, and then, the metal pad layer 6 is formed on the first layer 2A. As a result, it is possible to suppress propagation of the processing heat at the time of the cavity forming step by using the first metal layer 6A that is arranged between the second metal layer 6B and the first layer 2A. Furthermore, by suppressing a change in quality of the interfacial surface of the insulating resin layer that is included in the first layer 2A caused by the processing heat, it is possible to suppress a decrease in a sticking force between the metal pad layer 6 and the insulating resin layer that is included in the first layer 2A.

As a step of forming the metal pad layer 6, after having formed the wiring layer 4B on the first layer 2A in the process performed at the first electrolytic plating layer forming step illustrated in FIG. 8, the first metal layer 6A is formed on the first layer 2A at the second electrolytic plating layer forming step illustrated in FIG. 11. As a result, it is possible to form, at different timing, both of the wiring layer 4B that is the conductor layer 4 and the first metal layer 6A that are on the same layer.

Furthermore, in the thermal curing process that is used at the time of performing complete thermal curing on the filling resin that is located in a space portion inside the cavity 9 and the adhesive material 7 that is located on the lower surface of the electronic component 8, stress of a convex shape is generated in the electronic component 8 caused by thermal curing and shrinkage of the adhesive material 7. However, even when the stress acts on the metal pad layer 6 or the interfacial surface of the first layer 2A, it is possible to suppress an occurrence of delamination caused by the occurrence of the stress because the material of the first metal layer 6A is nickel having a high elastic modulus. Furthermore, by suppressing an occurrence of delamination, it is possible to suppress a deformation of the electronic component.

In the present embodiment, it is possible to suppress a decrease in a sticking force between the metal pad layer 6 and the first layer 2A, so that there is no need to decrease processing heat by reducing an output power of laser on purpose. As a result, by using sufficient processing heat, a smear does not remain on the second metal layer 6B included in the metal pad layer 6, so that it is possible to form the cavity 9 that is clean.

By suppressing an occurrence of delamination between the first metal layer 6A included in the metal pad layer 6 and the insulating resin layer included in the first layer 2A, it is possible to ensure flatness of a portion on which the electronic component 8 is mounted. As a result, it is possible to avoid a situation of variations in the interval between the electrode 50A of the semiconductor chip 50 and the connecting terminal 10 formed on the built-in component board 1 from occurring at the time of assembly of the semiconductor chip 50 onto the built-in component board 1. Then, it is possible to ensure the reliability of a connection between the electrode 50A of the semiconductor chip 50 and the connecting terminal 10.

Furthermore, by suppressing an occurrence of delamination, the variation in the height (inside the component or between components) of the electrode 8A located on the upper surface of the electronic component 8 is reduced, so that the variation in the thickness of the filling layer 2D that is located an upper layer of the electronic component 8 is also reduced. As a result, the depth of the via formed on the electrode 8A becomes uniform, so that it is possible to ensure the reliability of a connection between the via and the electrode 8A of the electronic component 8.

Figure 29:
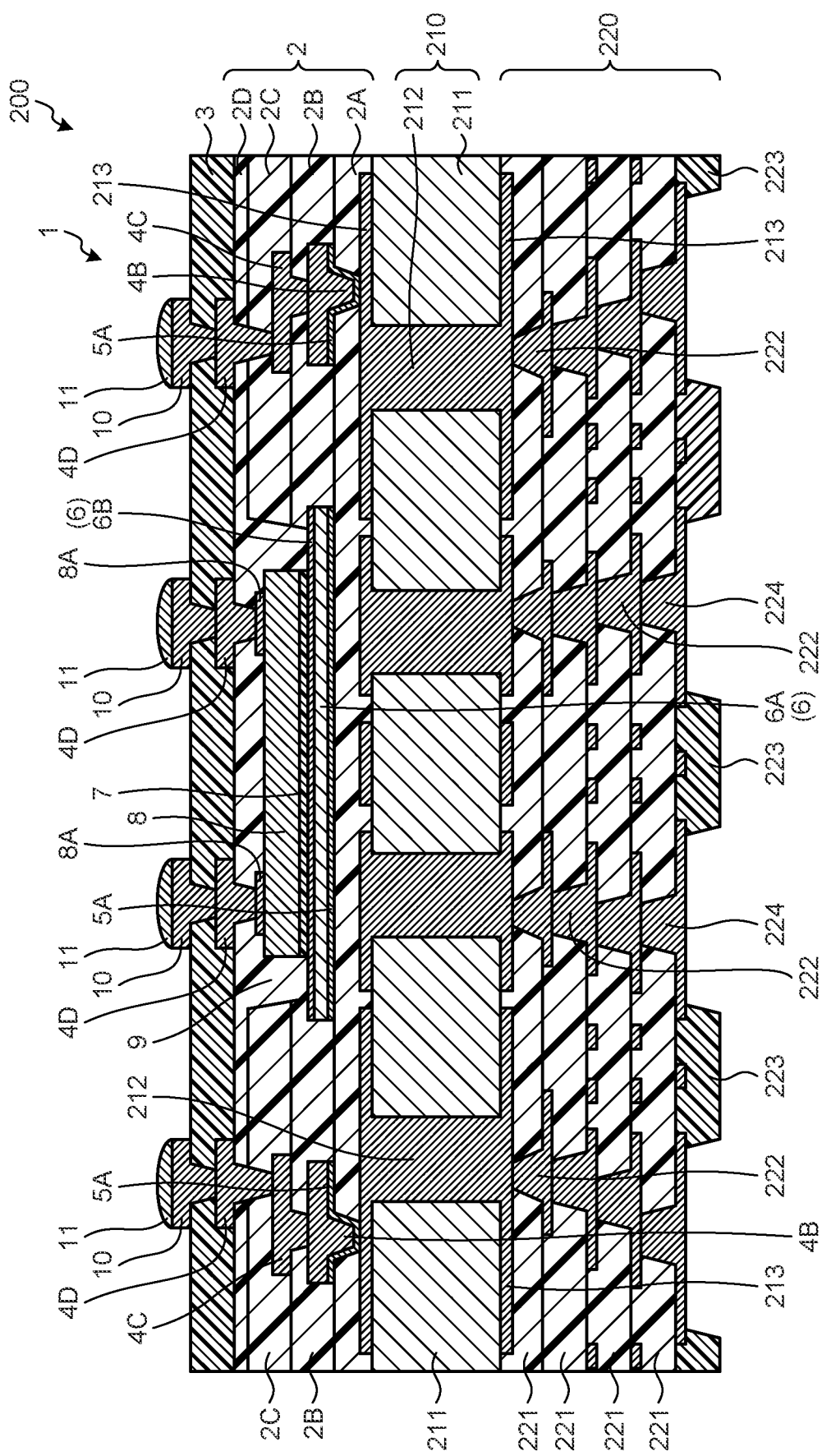
FIG. 29 is a diagram illustrating an example of a built-in component board (core build-up wiring board) according to a second embodiment.

Furthermore, the coreless build-up wiring board has been exemplified as the built-in component board 1 according to the first embodiment; however, the built-in component board 1 may be applied to a build-up wiring board with a core, and an embodiment thereof will be described as a second embodiment. FIG. 29 is a diagram illustrating an example of a core build-up wiring board with according to the second embodiment. Furthermore, by assigning the same reference numerals to components having the same configuration as those in the built-in component board 1 according to the first embodiment, overlapped descriptions of the configuration and the operation thereof will be omitted.

Second Embodiment

A core build-up wiring board 200 illustrated in FIG. 29 includes a multi-layer wiring structure (build-up layer) 2 that is arranged on the upper surface of a core board 210, and a multi-layer wiring structure 220 that is arranged on the lower surface of the core board 210. The multi-layer wiring structure 2 included in the core build-up wiring board 200 has a structure corresponding to the built-in component board 1 described in the first embodiment.

The core board 210 includes a core layer 211 and a penetrating electrode 212, and has a structure in which wiring layers 213 are formed on both surfaces of the core layer 211 that is a plate shaped insulating material and that has been subjected to metal plating.

The multi-layer wiring structure 220 is obtained by laminating layers including insulating layers 221 and electrically conductive wiring layers 222. The insulating layer 221 is formed by using a resin having an insulation property, such as an epoxy resin, a polyimide resin, or the like. Furthermore, the wiring layer 222 is formed of a metal made of copper by using, for example, a semi-additive process. In FIG. 29, four layers of the insulating layers 221 are laminated inside of the multi-layer wiring structure 220 that is located on the lower side of the core board 210; however, the number of layers of the insulating layers 221 to be laminated is not limited to four.

A solder resist layer 223 in the multi-layer wiring structure 220 is a layer that covers the surface of a wiring layer 224 of the multi-layer wiring structure 220 and that protects the wiring layer 224. The solder resist layer 223 is a layer that is formed of a photosensitive resin, such as an acryl resin or a polyimide resin, having an insulation property and that is one of insulating layers. Furthermore, the solder resist layer 223 may be formed by using a non-photosensitive resin, such as an epoxy resin, having an insulation property.

The solder resist layer 223 side in the core build-up wiring board 200 is the surface that is connected to an external component, an external device, or the like. At the position at which an external connecting terminal that is electrically connected to an external component or device is formed, an opening portion is drilled into the solder resist layer 223, and the wiring layer 224 of the multi-layer wiring structure 220 is exposed from the opening portion. At the opening portion, for example, an external connecting terminal, such as a solder ball, is formed. If the solder resist layer 223 is formed by using a photosensitive resin, it is possible to form the opening portion by performing a process of exposure and image development. Furthermore, if the solder resist layer 223 is formed by using a non-photosensitive resin, it is possible to form an opening portion by performing a process of laser beam machining.

The core build-up wiring board 200 according to the second embodiment is formed such that the multi-layer wiring structure 2 corresponding to the built-in component board 1 described in the first embodiment is formed on an upper surface of the core board 210 by using a build-up process. As a result, by suppressing a change in quality of the interfacial surface of the insulating resin layer that is included in the first layer 2A caused by processing heat generated at the time of the cavity forming step, it is possible to suppress a decrease in a sticking force between the metal pad layer 6 and the insulating resin layer that is included in the first layer 2A.

In the present embodiment, a floating island structure in which the metal pad layer 6 located on the bottom surface of the cavity 9 is not connected to another conductor layer is used; however, the embodiment is not limited to this. For example, the metal pad layer 6 may be connected to, by a via, another conductor layer that serves as a ground, and appropriate modifications are possible.

In the present embodiment, it is assumed that, after the electronic component 8 is installed inside the cavity 9 and a filling resin is filled, the adhesive material 7 is subjected to thermal curing with the filling resin; however, the adhesive material 7 may be subjected to thermal curing in an early stage. In other words, after the electronic component 8 is temporarily adhered, and before the filling resin is filled, the adhesive material 7 may be subjected to thermal curing while pressing the electronic component 8.

According to an aspect of an embodiment of the built-in component board disclosed in the present application, it is possible to suppress a decrease in a sticking force between a metal pad layer on which an electronic component is mounted and an insulating resin layer.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A built-in component board comprising:
a first insulating layer;
a wiring layer and a metal pad layer that are formed on the first insulating layer;
a second insulating layer that is formed on the wiring layer and the metal pad layer;
a cavity that is formed in the second insulating layer that exposes the metal pad layer;
an electronic component that is mounted on the metal pad layer; and
a filling layer that is filled in the cavity and that buries the electronic component, wherein a metal used for the metal pad layer includes a metal having thermal conductivity that is lower than that of a metal used for the wiring layer so that the metal pad layer suppresses a thermal conduction from the second insulating layer to the first insulating layer, and an outer peripheral edge of a top surface of the metal pad layer and a side surface of the metal pad layer are covered by the second insulating layer and a central part of the top surface of the metal pad layer is exposed from the cavity while maintaining the covering of the outer peripheral edge of the top surface of the metal pad layer and the side surface of the metal pad layer by the second insulating layer.

2. The built-in component board according to claim 1, wherein the metal pad layer includes a first metal layer that is formed on the first insulating layer and that is formed of the metal having thermal conductivity that is lower than that of the metal used for the wiring layer, and a second metal layer that is formed on the first metal layer.

3. The built-in component board according to claim 1, wherein the metal pad layer includes a first metal layer that is formed on the first insulating layer, and a second metal layer that is formed on the first metal layer and that is formed of the metal having thermal conductivity that is lower than that of the metal used for the wiring layer.

4. The built-in component board according to claim 1, wherein the metal pad layer is formed on the first insulating layer and is a metal layer formed of the metal having thermal conductivity that is lower than that of the metal used for the wiring layer.

5. The built-in component board according to claim 1, wherein the metal used for the wiring layer is copper, and the metal having the thermal conductivity that is lower than that of the metal used for the wiring layer is nickel.

6. The built-in component board according to claim 1, wherein the metal having the thermal conductivity that is lower than that of the metal used for the wiring layer is a metal subjected to roughened nickel plating.

7. The built-in component board according to claim 1, wherein the metal having the thermal conductivity that is lower than that of the metal used for the wiring layer is a metal having an elastic modulus that is higher than that of the metal used for the wiring layer.

8. A method of manufacturing a built-in component board comprising:

a step of forming a first insulating layer;

a step of forming a wiring layer and a metal pad layer on the first insulating layer;

a step of forming a second insulating layer on the wiring layer and the metal pad layer;

a step of forming a cavity in the second insulating layer so as to expose the metal pad layer from the cavity;

a step of mounting an electronic component on the metal pad layer; and a step of filling the cavity and forming a filling layer that buries the electronic component, wherein a metal used for the metal pad layer includes a metal having thermal conductivity that is lower than that of a metal used for the wiring layer so that the metal pad layer suppresses a thermal conduction from the second insulating layer to the first insulating layer, the step of forming the second insulating layer on the metal pad layer includes a step of covering an outer peripheral edge of a top surface of the metal pad layer and a side surface of the metal pad layer by the second insulating layer, and the step of forming the cavity includes a step of exposing a central part of the top surface of the metal pad layer from the cavity while maintaining the covering of the outer peripheral edge of the top surface of the metal pad layer and the side surface of the metal pad layer by the second insulating layer.

9. The method of manufacturing the built-in component board according to claim 8, wherein the step of forming the wiring layer and the metal pad layer on the first insulating layer includes a step of forming, on the first insulating layer, a first metal layer formed of a metal having thermal conductivity that is lower than that of a metal used for the wiring layer, and a step of forming a second metal layer on the first metal layer to form the metal pad layer.

10. The method of manufacturing the built-in component board according to claim 9, wherein the step of forming the wiring layer and the metal pad layer on the first insulating layer includes a step of forming the wiring layer on the first insulating layer, and a step of forming the first metal layer on the first insulating layer.

11. The method of manufacturing the built-in component board according to claim 8, wherein the step of forming the cavity includes a step of forming the cavity by performing a process of laser beam machining to the second insulating layer.

* * * * *